US011908967B2

(12) United States Patent
Kondo et al.

(10) Patent No.: US 11,908,967 B2
(45) Date of Patent: Feb. 20, 2024

(54) LIGHT-EMITTING DEVICE AND MEASUREMENT DEVICE

(71) Applicant: FUJIFILM Business Innovation Corp., Tokyo (JP)

(72) Inventors: Takashi Kondo, Kanagawa (JP); Seiji Ono, Kanagawa (JP); Daisuke Iguchi, Kanagawa (JP); Tomoaki Sakita, Kanagawa (JP)

(73) Assignee: FUJIFILM Business Innovation Corp., Tokyo (JP)

( * ) Notice: Subject to any disclaimer, the term of this patent is extended or adjusted under 35 U.S.C. 154(b) by 161 days.

(21) Appl. No.: 17/406,189

(22) Filed: Aug. 19, 2021

(65) Prior Publication Data

US 2022/0336692 A1    Oct. 20, 2022

(30) Foreign Application Priority Data

Apr. 14, 2021    (JP) .................. 2021-068714

(51) Int. Cl.
*H01L 31/12* (2006.01)
*G01B 11/24* (2006.01)
*H01L 29/74* (2006.01)
*H01L 27/15* (2006.01)

(52) U.S. Cl.
CPC ............. *H01L 31/12* (2013.01); *G01B 11/24* (2013.01); *H01L 27/156* (2013.01); *H01L 29/7412* (2013.01)

(58) Field of Classification Search
CPC ... G01B 11/24; H01L 27/156; H01L 29/7412; H01L 31/12; H01L 25/167
See application file for complete search history.

(56) References Cited

U.S. PATENT DOCUMENTS

| 7,948,004 | B2 | 5/2011 | Suzuki | |
|---|---|---|---|---|
| 2020/0066697 | A1* | 2/2020 | Yoshimura | .............. H01L 28/40 |
| 2021/0176445 | A1* | 6/2021 | Wang | .................... G01B 21/042 |
| 2021/0265807 | A1* | 8/2021 | Iguchi | .................... G06V 20/64 |
| 2021/0349510 | A1* | 11/2021 | Xie | ......................... H05B 45/20 |

FOREIGN PATENT DOCUMENTS

| JP | H01-238962 A | 9/1989 |
|---|---|---|
| JP | 2001-308385 A | 11/2001 |
| JP | 2009-286048 A | 12/2009 |

* cited by examiner

*Primary Examiner* — Tri T Ton
(74) *Attorney, Agent, or Firm* — Oliff PLC

(57) ABSTRACT

A light-emitting device includes one or more light-emitting units each including a light-emitting element including a function of a thyristor; an electrode for light emission to which a first voltage is applied for light emission of the light-emitting unit; and one or more light emission permission thyristors that permit the light-emitting element to emit light by a second voltage that is lower than the first voltage and set irrespective of the first voltage.

6 Claims, 14 Drawing Sheets

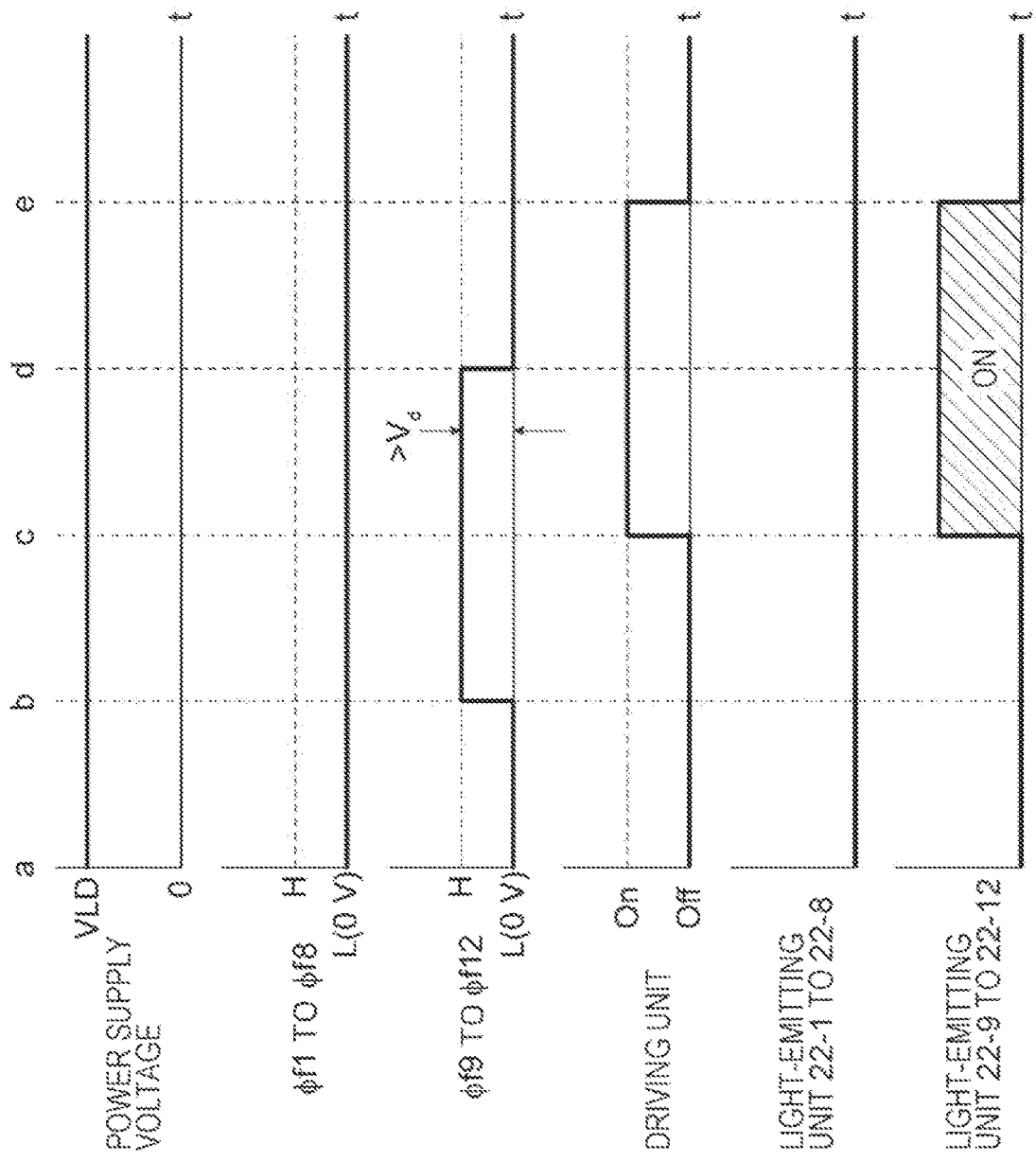

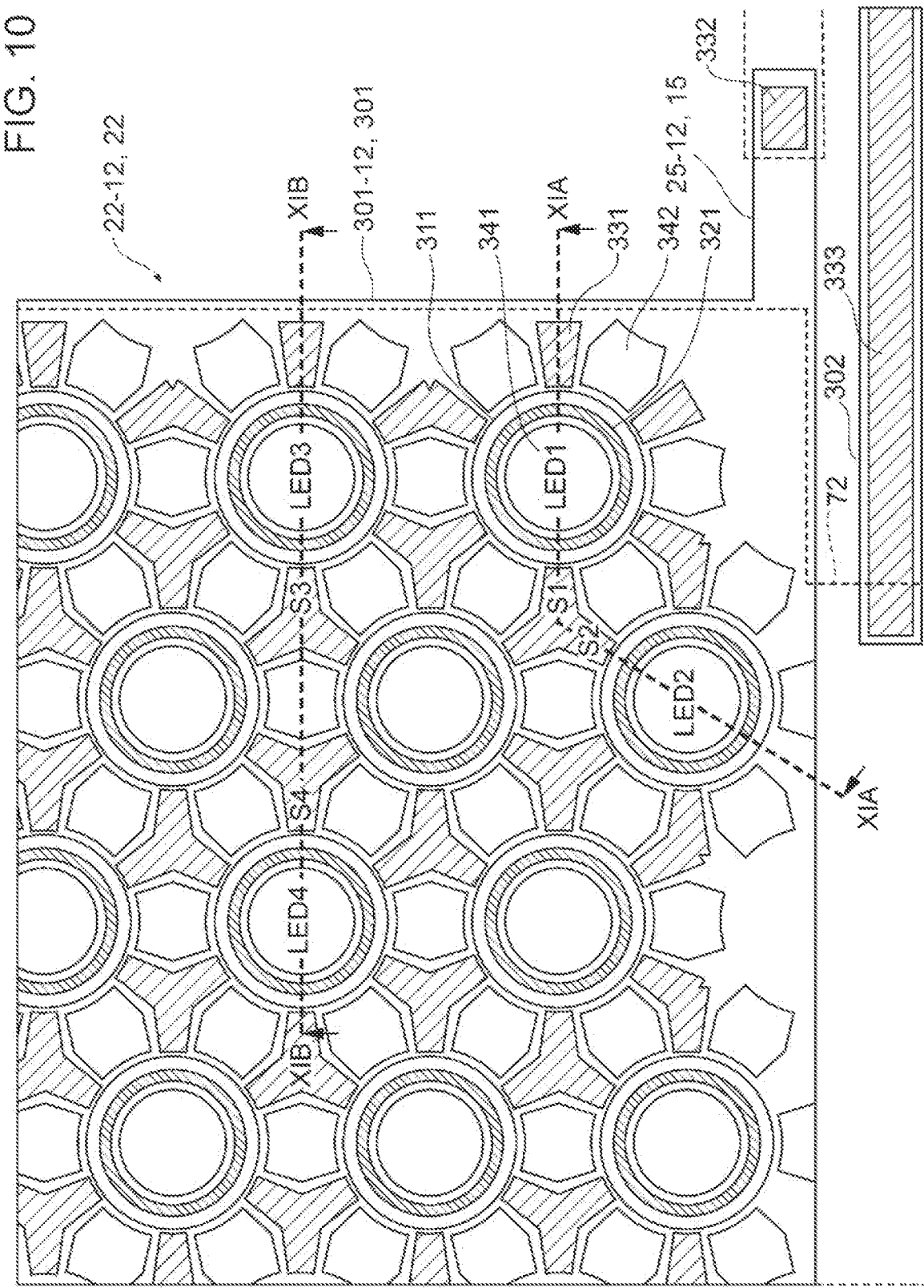

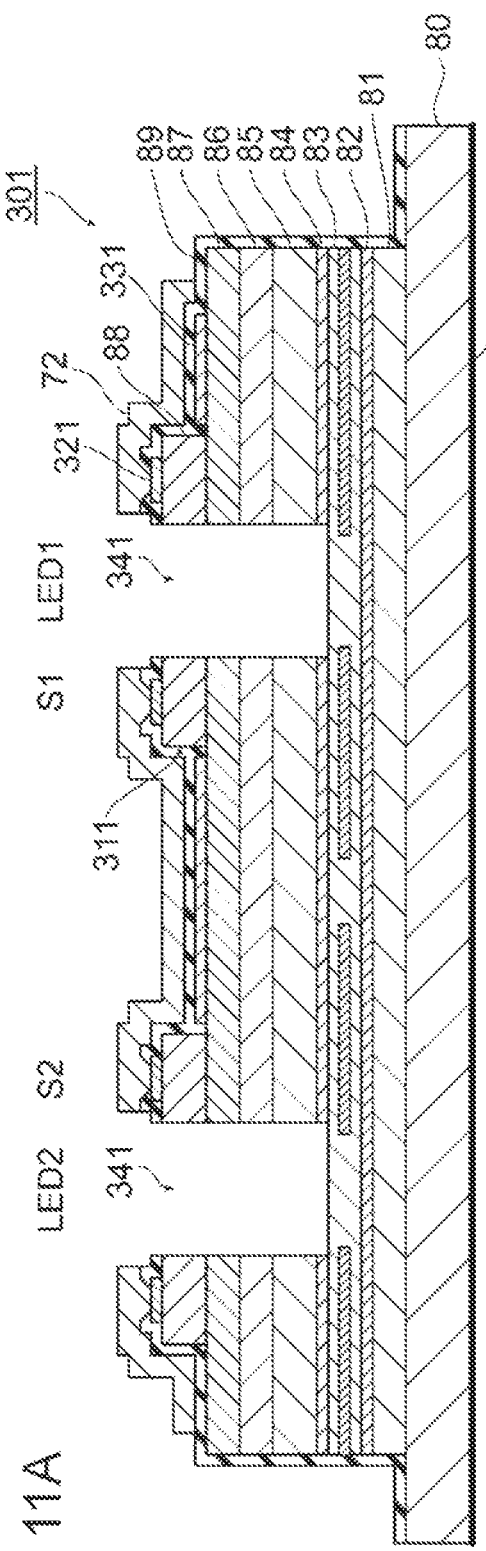
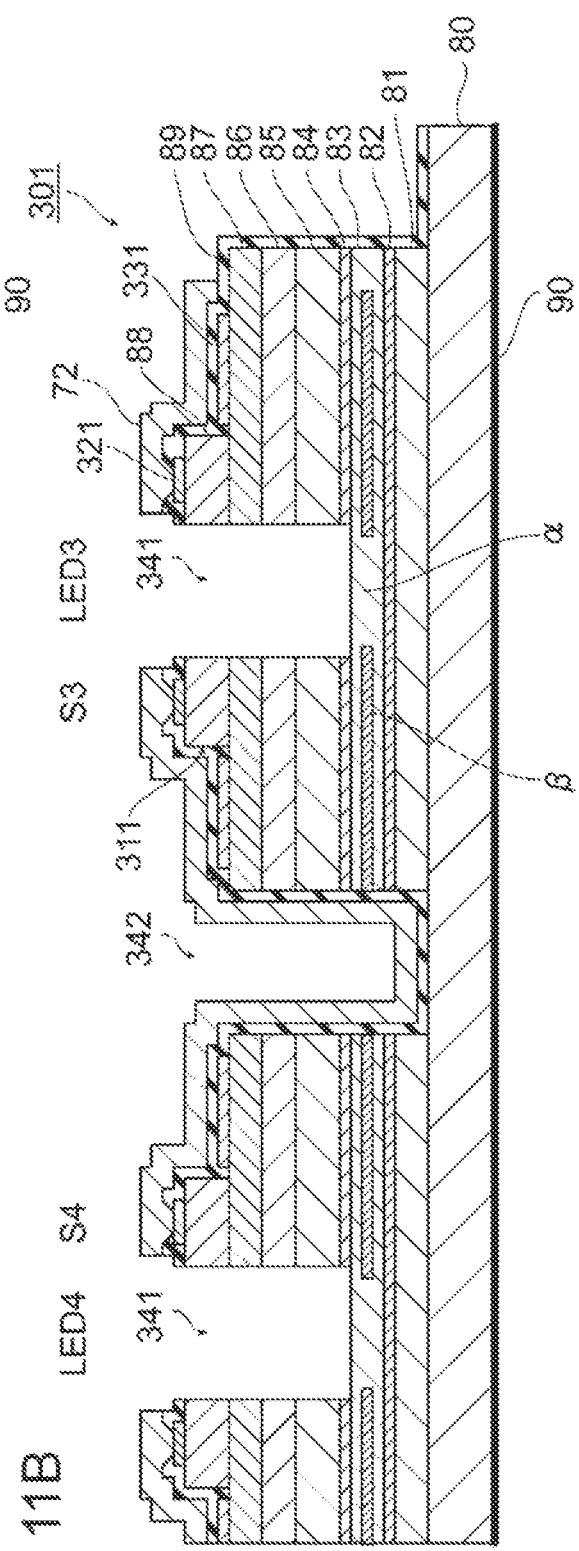

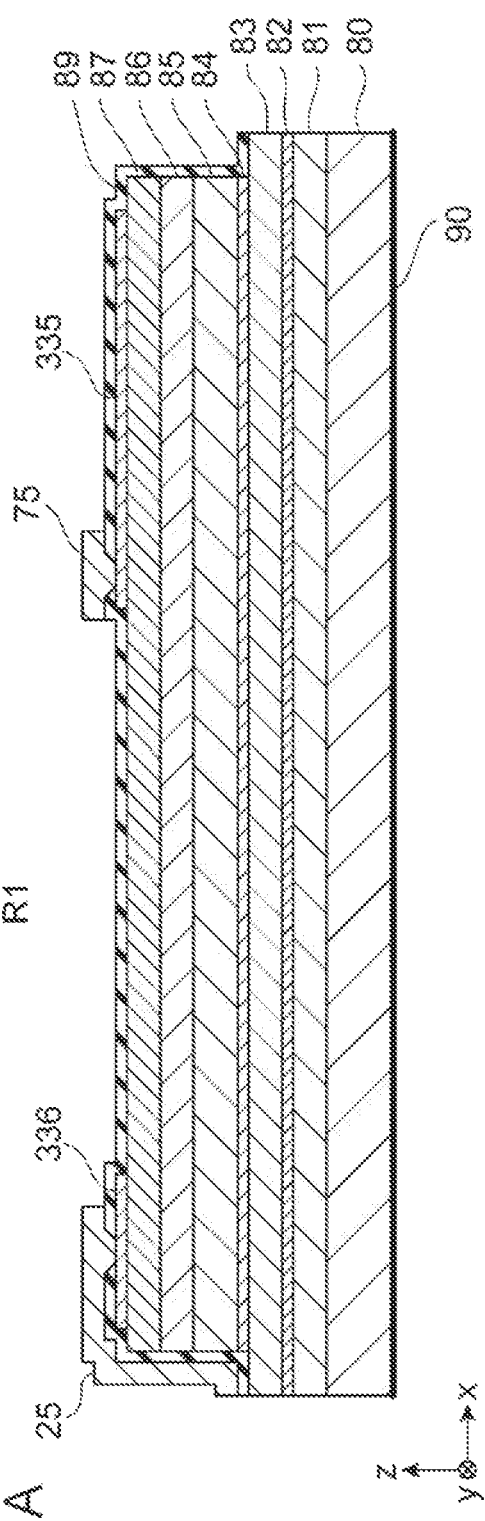
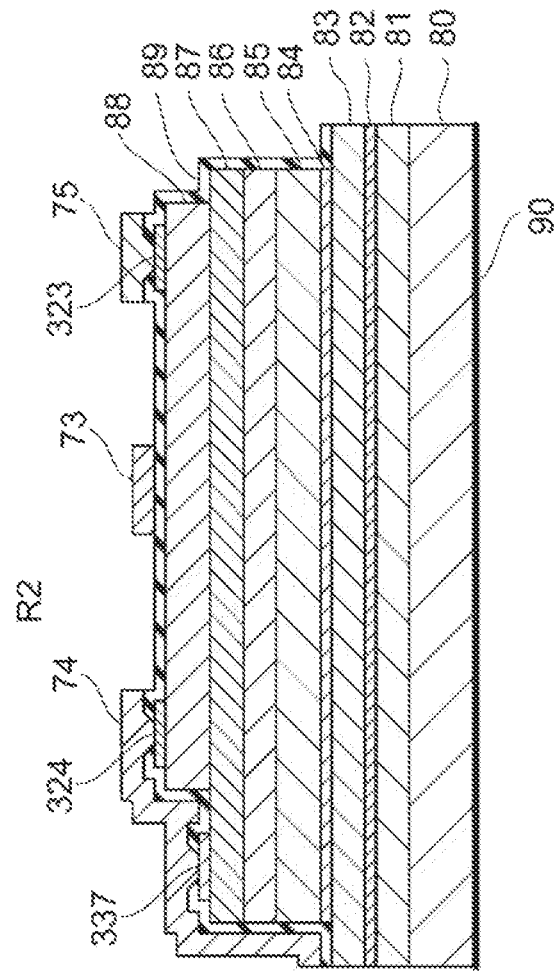

LIGHT-EMITTING DEVICE AND MEASUREMENT DEVICE

CROSS-REFERENCE TO RELATED APPLICATIONS

This application is based on and claims priority under 35 USC 119 from Japanese Patent Application No. 2021-068714 filed Apr. 14, 2021.

BACKGROUND

(i) Technical Field

The present disclosure relates to a light-emitting device and a measurement device.

(ii) Related Art

Japanese Unexamined Patent Application Publication No. 01-238962 describes a light-emitting element array in which a large number of light-emitting elements whose threshold voltage or threshold current is externally controllable by light are aligned one-dimensionally, two-dimensionally, or three-dimensionally, at least part of light generated from each of the light-emitting elements enters another light-emitting element close to the light-emitting element, and a clock line that externally applies a voltage or a current to each of the light-emitting elements.

Japanese Unexamined Patent Application Publication No. 2001-308385 describes a self-scanning light-emitting device in which a light-emitting element of pnpnpn six-layer semiconductor structure is provided, a p-type first layer and an n-type sixth layer on both ends and a p-type third layer and an n-type fourth layer in the center are provided with an electrode, pn layers are given a light-emitting diode function, and pnpn four layers are given a thyristor function.

Japanese Unexamined Patent Application Publication No. 2009-286048 describes a self-scanning light source head including a substrate, surface-emitting semiconductor lasers provided in an array on the substrate, and thyristors that are aligned on the substrate and serve as switch elements for selectively turning on and off light emission of the surface-emitting semiconductor lasers.

SUMMARY

In a method for measuring a three-dimensional shape of an object to be measured by irradiating the object to be measured with light from a light-emitting device and receiving light reflected by the object to be measured, it is sometimes required to set a voltage for light emission high in order to increase an intensity of light from a light-emitting unit in the light-emitting device. Meanwhile, a signal that permits the light-emitting unit to emit light is required to be a voltage supplied by global parallel I/O (GPIO) or the like that is lower than the voltage for causing the light-emitting unit to emit light irrespective of the voltage for causing the light-emitting unit to emit light.

Aspects of non-limiting embodiments of the present disclosure relate to a light-emitting device etc. that can lower a voltage of a signal that permits a light-emitting element to emit light as compared with a case where no light emission permission thyristor is provided.

Aspects of certain non-limiting embodiments of the present disclosure address the above advantages and/or other advantages not described above. However, aspects of the non-limiting embodiments are not required to address the advantages described above, and aspects of the non-limiting embodiments of the present disclosure may not address advantages described above.

According to an aspect of the present disclosure, there is provided a light-emitting device including one or more light-emitting units each including a light-emitting element including a function of a thyristor; an electrode for light emission to which a first voltage is applied for light emission of the light-emitting unit; and one or more light emission permission thyristors that permit the light-emitting element to emit light by a second voltage that is lower than the first voltage and set irrespective of the first voltage.

BRIEF DESCRIPTION OF THE DRAWINGS

An exemplary embodiment of the present disclosure will be described in detail based on the following figures, wherein:

FIG. 9 is a timing diagram for explaining operation of the light-emitting device;

FIG. 10 is an enlarged plan view of a light-emitting unit;

FIGS. 11A and 11B are cross-sectional views of the light-emitting unit, FIG. 11A is a cross-sectional view taken along line XIA-XIA in FIG. 10, and FIG. 11B is a cross-sectional view taken along line XIB-XIB in FIG. 10;

FIG. 13A is a cross-sectional view taken along line XIIIA-XIIIA in FIG. 12, and FIG. 12B is a cross-sectional view taken along line XIIIB-XIIIB in FIG. 12; and FIGS. 14A and 14B are other cross-sectional views of the permission circuit, FIG. 14A is a cross-sectional view taken along line XIVA-XIVA in FIG. 12, and FIG. 14B is a cross-sectional view taken along line XIVB-XIVB in FIG. 12.

DETAILED DESCRIPTION

An exemplary embodiment of the present disclosure is described in detail below with reference to the accompanying drawings.

Some measurement devices for measuring a three-dimensional shape (hereinafter referred to as a 3D shape) of an object to be measured measure a three-dimensional shape based on a Time of Flight (ToF) method using a flight time of light. According to the ToF method, a period from a timing of emission of light from a light-emitting device provided in a measurement device to a timing of reception of the light, by a three-dimensional sensor (hereinafter referred to as a 3D sensor) provided in the measurement device, reflected by the object to be measured is measured. Then, a 3D shape of the object to be measured is specified based on the measured period. A target of measurement of a 3D shape is referred to as an object to be measured. A three-dimensional shape may be referred to as a three-dimensional image. Measurement of a three-dimensional shape may be referred to as three-dimensional measurement, 3D measurement, or 3D sensing.

Such a measurement device is applied to recognition of an object to be measured from a measured 3D shape. For example, such a measurement device is mounted on a mobile information processing apparatus or the like and is used, for example, for recognition of a face of a user who tries to access the mobile information processing apparatus. That is, such a measurement device acquires a 3D shape of a face of a user who accesses the mobile information processing apparatus, determines whether or not the user has access permission, and permits the user to use the mobile information processing apparatus only in a case where the user is recognized as having access permission.

Furthermore, this measurement device is also applied to a case where a 3D shape of an object to be measured is continuously measured (e.g., Augmented Reality (AR)). In this case, a distance to the object to be measured does not matter.

Such a measurement device is applicable to an information processing apparatus, such as a personal computer (PC), other than a mobile information processing apparatus.

It is assumed here that an information processing apparatus is a mobile information processing apparatus as an example and that a user is authenticated by recognition of a face captured as a 3D shape.

Information Processing Apparatus 1

Figure 1:
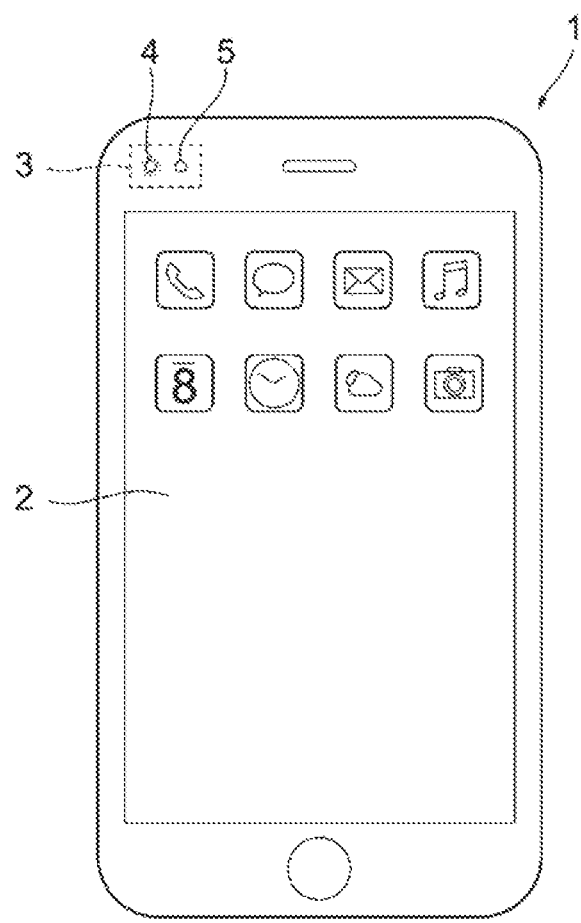
FIG. 1 illustrates an example of an information processing apparatus.

FIG. 1 illustrates an example of an information processing apparatus 1. As described above, the information processing apparatus 1 is a mobile information processing apparatus as an example.

The information processing apparatus 1 includes a user interface unit (hereinafter referred to as a UI unit) 2 and an optical device 3 that measures a 3D shape. The UI unit 2 is, for example, configured such that a display device that displays information for a user and an input device that receives an instruction for information processing given by a user's operation are integrated. The display device is, for example, a liquid crystal display or an organic EL display, and the input device is, for example, a touch panel.

The optical device 3 includes a light-emitting device 4 and a 3D sensor 5. The light-emitting device 4 radiates light toward an object to be measured (a face in this example). The 3D sensor 5 acquires light reflected back by the face. In this example, a 3D shape is measured based on the ToF method using a flight time of light. Then, the face is recognized based on the 3D shape. As described earlier, a 3D shape of an object to be measured other than a face may be measured. A measurement device that measures a 3D shape includes the light-emitting device 4 and the 3D sensor 5.

The information processing apparatus 1 is a computer including a CPU, a ROM, and a RAM. Examples of the ROM include a non-volatile rewritable memory, for example, a flash memory. A program or a constant number stored in the ROM is loaded into the RAM, and the CPU executes the program. In this way, the information processing apparatus 1 operates, and various kinds of information processing are executed.

Figure 2:
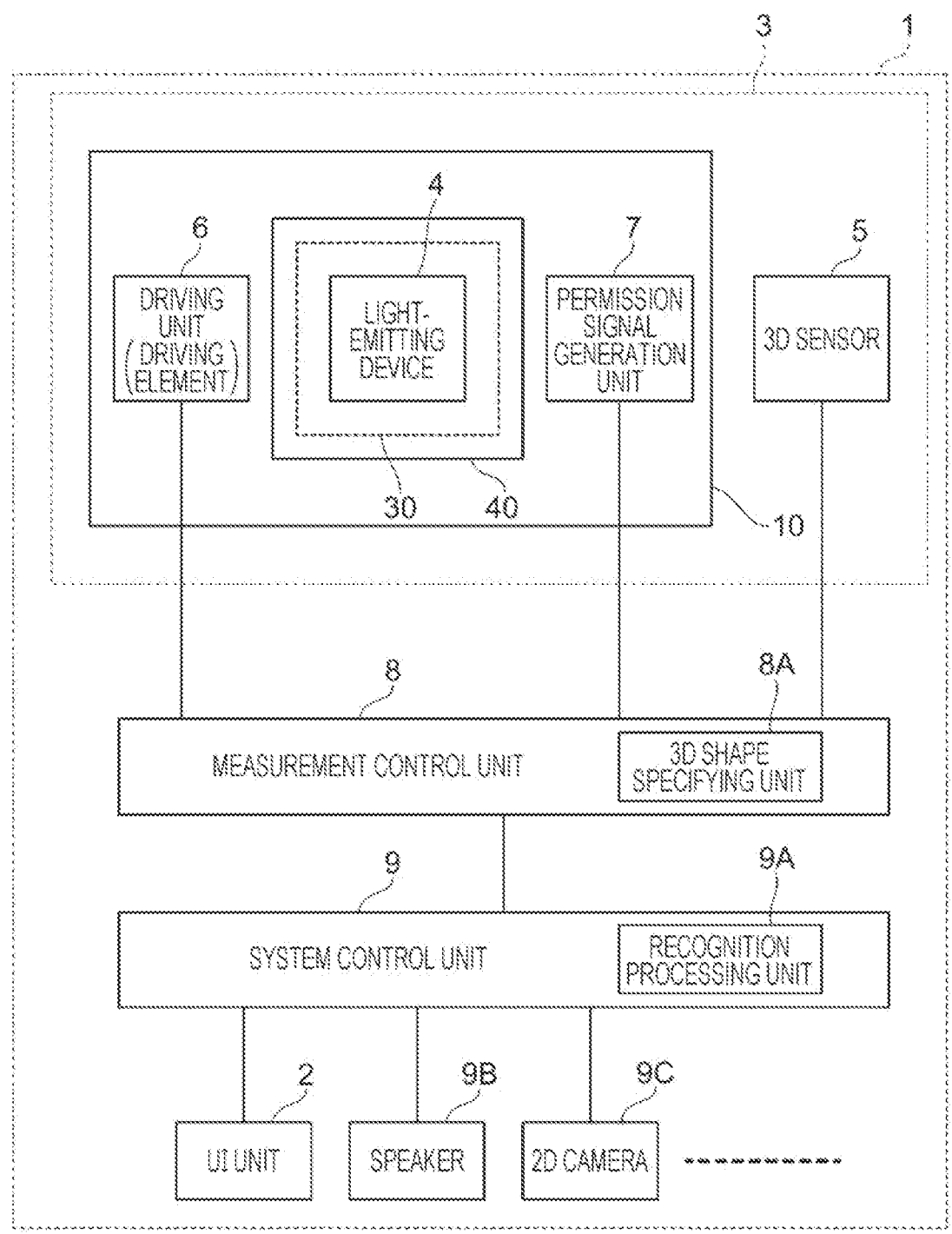
FIG. 2 is a block diagram for explaining a configuration of the information processing apparatus.

FIG. 2 is a block diagram for explaining a configuration of the information processing apparatus 1.

The information processing apparatus 1 includes the optical device 3, a measurement control unit 8, and a system control unit 9. The measurement control unit 8 measures a 3D shape by controlling the optical device 3. The measurement control unit 8 includes a 3D shape specifying unit 8A. The system control unit 9 controls the whole information processing apparatus 1 as a system. The system control unit 9 includes a recognition processing unit 9A. The system control unit 9 is connected to the UI unit 2, a speaker 9B, a two-dimensional camera (referred to as a 2D camera in FIG. 2) 9C, and the like.

The 3D shape specifying unit 8A included in the measurement control unit 8 specifies a 3D shape of an object to be measured by measuring a 3D shape based on light reflected by the object to be measured. The recognition processing unit 9A included in the system control unit 9 recognizes the object to be measured (a face in this example) based on the 3D shape specified by the 3D shape specifying unit 8A. Then, the recognition processing unit 9A included in the system control unit 9 distinguishes whether or not a user has access permission based on the recognized face.

The optical device 3 includes a driving unit 6, a permission signal generation unit 7, a wiring substrate 10, a light diffusion member 30, and a holding unit 40 in addition to the light-emitting device 4 and the 3D sensor 5. The driving unit 6 drives the light-emitting device 4 by supplying a current for light emission to the light-emitting device 4. The permission signal generation unit 7 generates a signal permitting the light-emitting device 4 to emit light.

The light-emitting device 4, the driving unit 6, the permission signal generation unit 7, the light diffusion member 30, and the holding unit 40 are disposed on the wiring substrate 10. The light-emitting device 4, the driving unit 6, and the permission signal generation unit 7 are connected by a wire provided in the wiring substrate 10.

The light diffusion member 30 is provided on a path of light emitted by the light-emitting device 4 and causes light emitted by the light-emitting device 4 to be radiated in a desired direction. For example, the light diffusion member 30 is held by the holding unit 40 provided on the wiring substrate 10 and covers the light-emitting device 4. Note that the wiring substrate 10 may include a resistive element and a capacitive element for causing the light-emitting device 4, the driving unit 6, and the permission signal generation unit 7 to operate. The light-emitting device 4 may be provided on a heat releasing base member having a higher coefficient of thermal conductivity than the wiring substrate 10. Examples of the heat releasing base member include alumina ($Al_2O_3$) having a coefficient of thermal conductivity of 20 W/m·K to 30 W/m·K, silicon nitride ($Si_3N_4$) having a coefficient of thermal conductivity of approximately 85 W/m·K, and aluminum nitride (AlN) having a coefficient of thermal conductivity of 150 W/m·K to 250 W/m·K as compared with a coefficient of thermal conductivity of approximately 0.4 W/m·K of an insulating layer called FR-4 used for the wiring substrate 10. Although a case where the wiring substrate 10 is provided with a wire is described, the wiring substrate 10 may be a substrate that is provided with no wire. The wiring substrate 10 may be any substrate that holds members such as the light-emitting device 4, the driving unit 6, and the permission signal generation unit 7 in a manner such that the light-emitting device 4, the driving unit 6, and the permission signal generation unit 7 are electrically connected to each other.

Figure 3:
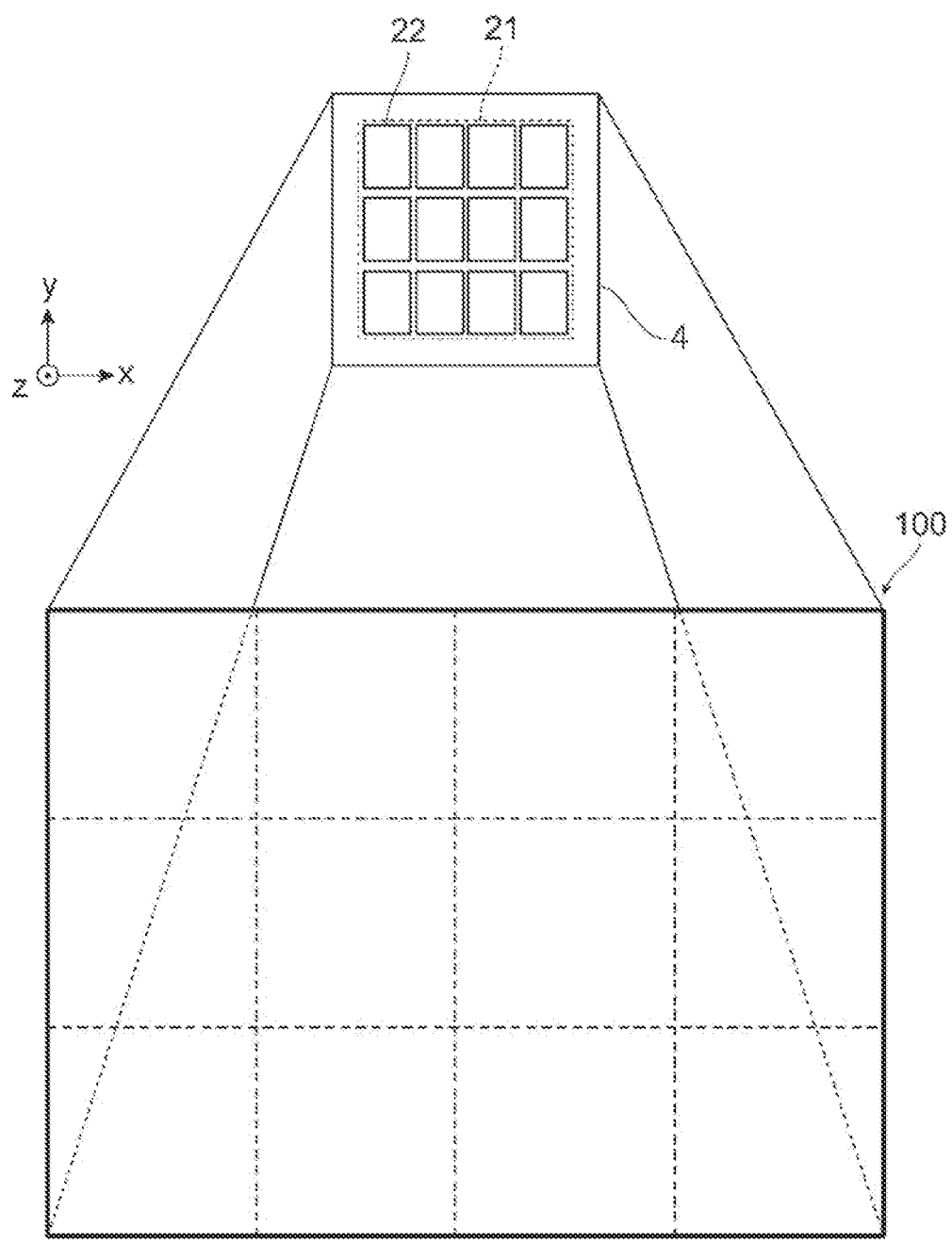
FIG. 3 is a perspective view for explaining a state where a light-emitting device irradiates an irradiation region in a divided manner.

FIG. 3 is a perspective view for explaining a state where the light-emitting device 4 irradiates an irradiation region 100 in a divided manner. In FIG. 3, the rightward direction, the upward direction, and a direction toward the irradiation region 100 in a portion where the light-emitting device 4 is provided on the paper on which FIG. 3 is drawn are an x direction, a y direction, and a z direction, respectively.

The light-emitting device 4 includes, for example, 12 light-emitting units 22. The 12 light-emitting units 22 are collectively referred to as a light output unit 21. The 12 light-emitting units 22 are arranged in a matrix of four light-emitting units 22 in the x direction and three light-emitting units 22 in the y direction. Each of the light-emitting units 22 may emit light individually or plural light-emitting units 22 may emit light concurrently. Furthermore, all of the light-emitting units 22 may emit light concurrently.

The irradiation region 100 is a range irradiated with light emitted by the light-emitting device 4 in order to measure a 3D shape of an object to be measured. The light-emitting units 22 are different in irradiation range. That is, the light-emitting device 4 irradiates the irradiation region 100 in a divided manner. Light emitted by the light-emitting units 22 passes the light diffusion member 30 (see FIG. 2), so that an irradiation direction and/or spread of light are set. Note that an optical member such as a diffractive optical element (DOE) that outputs light after changing a direction of incident light to a different direction or a transparent member such as a collecting lens, a microlens, or a protection cover may be provided instead of the light diffusion member 30.

Figure 4:
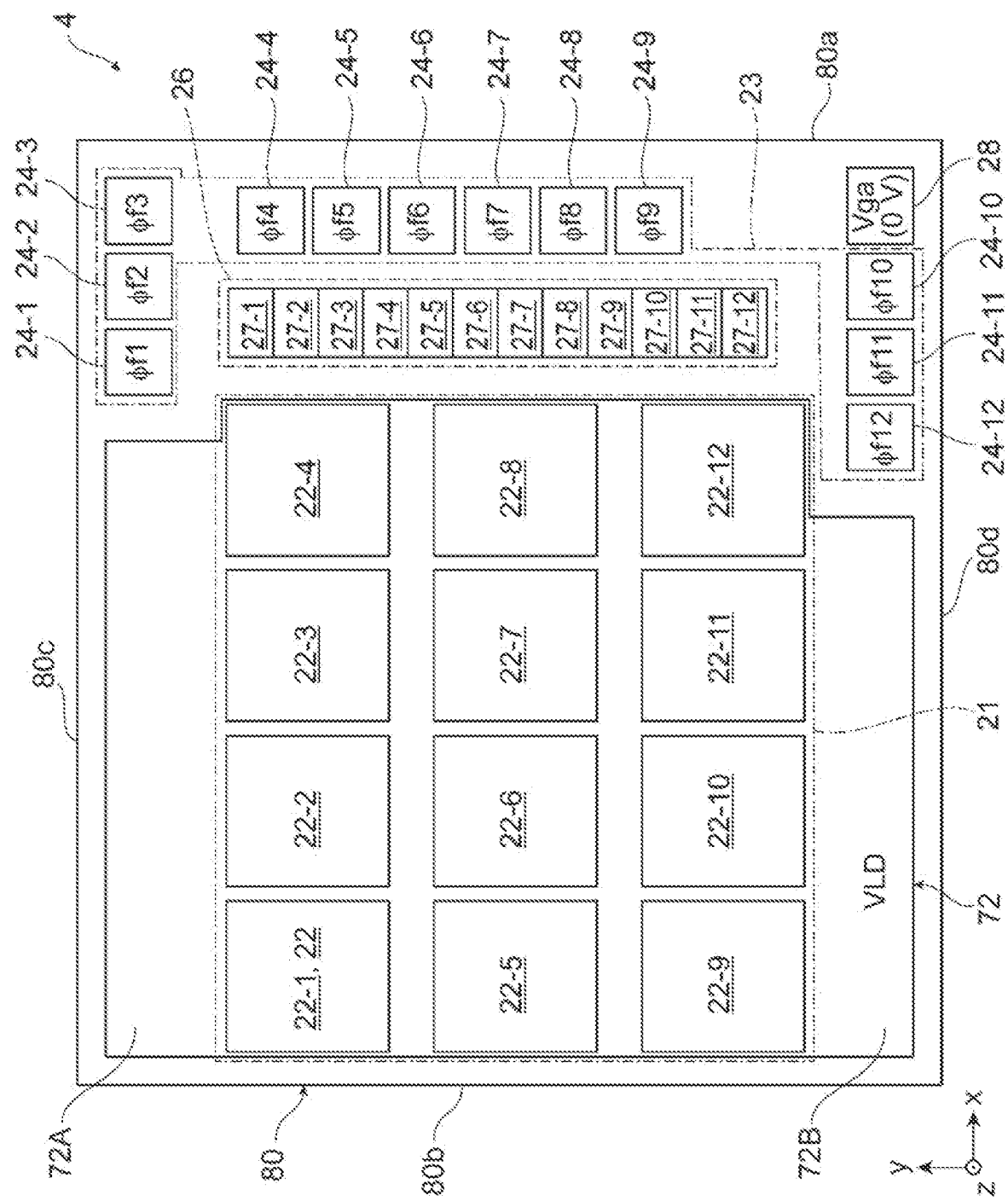
FIG. 4 is a layout diagram for explaining a light-emitting device to which the present exemplary embodiment is applied.

FIG. 4 is a layout diagram for explaining the light-emitting device 4 to which the present exemplary embodiment is applied. The x direction, y direction, and z direction in FIG. 4 are similar to those in FIG. 3.

The light-emitting device 4 includes a substrate 80, the light output unit 21, a terminal unit 23, a light emission permission unit 26, and a reference voltage terminal 28. The light output unit 21 includes the 12 light-emitting units 22. The terminal unit 23 receives a permission signal φf permitting the light-emitting units 22 to emit light from the permission signal generation unit 7. The light emission permission unit 26 causes the light-emitting units 22 to emit light when the terminal unit 23 receives the permission signal φf. The reference voltage terminal 28 receives a reference voltage. The reference voltage is a grounding voltage GND and is expressed as a reference voltage Vga (0 V). Note that the reference voltage terminal 28 is an example of another terminal unit.

On the substrate 80 (see FIG. 11, which will be described later), the light output unit 21, the terminal unit 23, the light emission permission unit 26, and the reference voltage terminal 28 are provided. The substrate 80 has a side surface 80a on an x direction side, a side surface 80b on a −x direction side, a side surface 80c on a +y direction side, and a side surface 80d on a −y direction side. Note that the side surface 80a is an example of a first side surface, the side surface 80b is an example of a second side surface, the side surface 80c is an example of a third side surface, and the side surface 80d is an example of a fourth side surface.

The light output unit 21 includes, for example, the 12 light-emitting units 22 arranged in a matrix (four in the x direction and three in the y direction). The light-emitting units 22 are referred to as light-emitting units 22-1 to 22-12 to distinguish the light-emitting units 22. The light-emitting units 22-1 to 22-4, the light-emitting units 22-5 to 22-8, and the light-emitting units 22-9 to 22-12 are aligned in the x direction, and the alignment of the light-emitting units 22-1 to 22-4, the alignment of the light-emitting units 22-5 to 22-8, and the alignment of the light-emitting units 22-9 to 22-12 are aligned in the −y direction.

An electrode for light emission 72 is provided common to all of the light-emitting units 22 on the light output unit 21 (z direction side). The electrode for light emission 72 has, on ±y direction sides, pad units 72A and 72B to which a wire for supplying a current for light emission is connected. A wire for supplying a power supply voltage VLD for supplying a current for light emission is connected to the pad units 72A and 72B. Note that only a frame of the electrode for light emission 72 is illustrated so that the light-emitting units 22 below the electrode for light emission 72 is visible.

The terminal unit 23 includes signal terminals 24 that receive permission signals φf permitting the respective light-emitting units 22 to emit light from the permission signal generation unit 7. The permission signals φf are referred to as permission signals φf1 to φf12 in order to distinguish the permission signals φf for the respective light-emitting units 22, and the signal terminals 24 are referred to as signal terminals 24-1 to 24-12 in order to distinguish the signal terminals 24 for the respective light-emitting units. The terminal unit 23 is gathered on the +x direction side of the light output unit 21.

The light emission permission unit 26 includes permission circuits 27 that permit the respective light-emitting units 22 to emit light. The permission circuits 27 are referred to as permission circuits 27-1 to 27-12 in order to distinguish the permission circuits 27 for the respective light-emitting units 22. The light emission permission unit 26 is provided between the light output unit 21 and the terminal unit 23.

The reference voltage terminal 28 is provided at an end of the substrate 80 on the +x direction side and the −y direction side. In a case where the reference voltage terminal 28 is provided on the substrate 80, it becomes easy to supply the reference voltage Vga (0 V) to the light emission permission unit 26.

Figure 5:
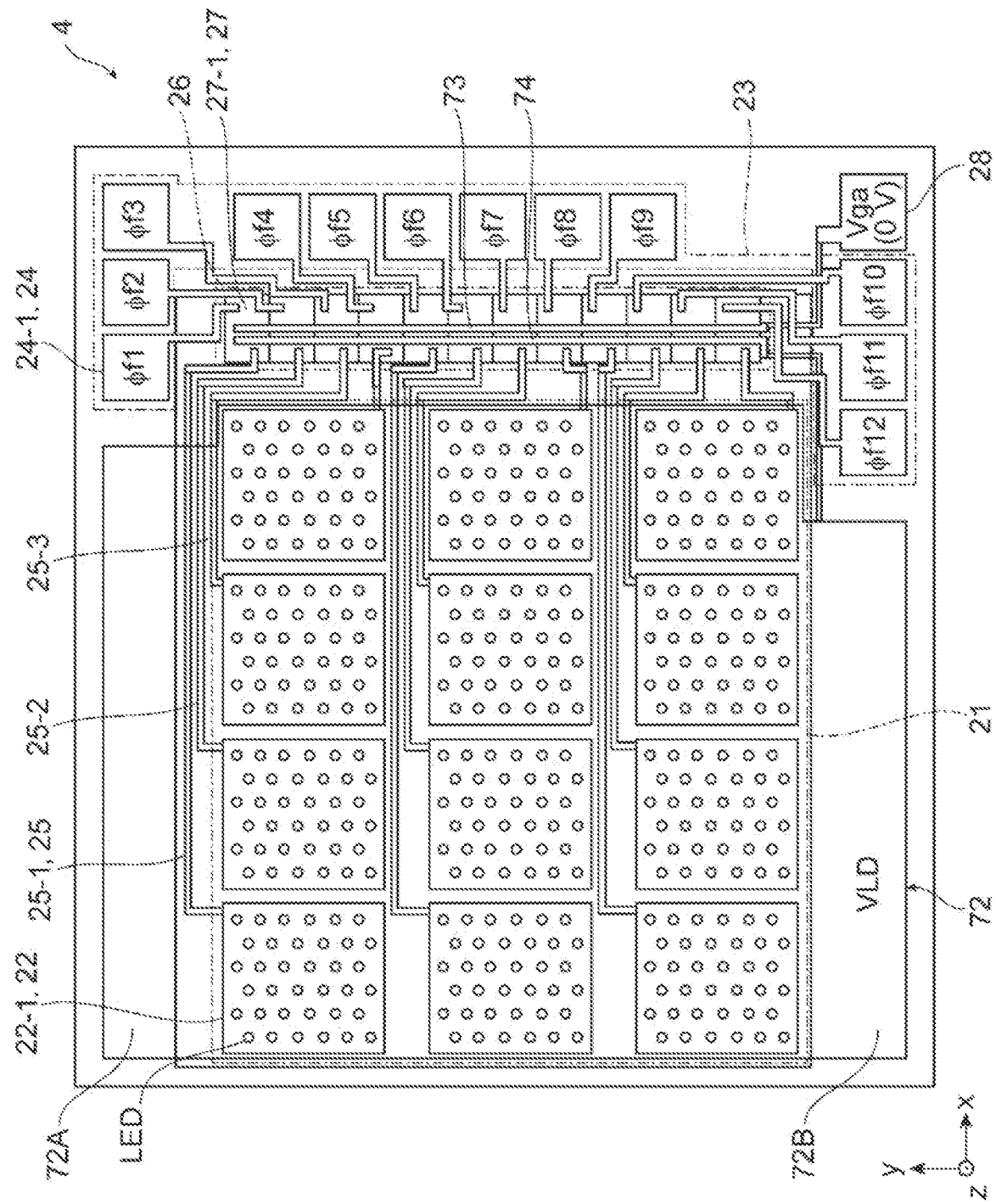
FIG. 5 is an example of a plan view of the light-emitting device to which the present exemplary embodiment is applied.

FIG. 5 is an example of a plan view of the light-emitting device 4 to which the present exemplary embodiment is applied. The x direction, the y direction, and the z direction in FIG. 5 are similar to those in FIG. 4. FIG. 5 is a view for explaining in more detail the light-emitting device 4 whose layout is illustrated in FIG. 4. In FIG. 5, some reference signs are omitted.

The circles illustrated on the light-emitting units 22 indicate light-emitting elements. That is, each of the light-emitting units 22 includes plural light-emitting elements. Note that the light-emitting units 22 may include the same number of light-emitting elements or may include different numbers of light-emitting elements. Each of the light-emitting units 22 may include a single light-emitting element.

The light-emitting units 22 of the light output unit 21 are connected to the respective permission circuits 27 of the light emission permission unit 26 by respective wires 25. The wires 25 are referred to as wires 25-1 to 25-12 in order to distinguish the wires 25 for the respective light-emitting units 22. In FIG. 5, the wire 25-1 that connects the light-emitting unit 22-1 and the permission circuit 27-1, the wire 25-2 that connects the light-emitting unit 22-2 and the permission circuit 27-2, and the wire 25-3 that connects the light-emitting unit 22-3 and the permission circuit 27-3 are illustrated, and illustration of the other wires 25-4 to 25-12 is omitted.

The wires 25 are provided along the light-emitting units 22 outside the light-emitting units 22. This allows light-emitting diodes LED to be provided in a higher density than a case where the wires 25 are provided inside the light-emitting units 22, that is, on surfaces of the light-emitting units 22.

The permission circuits 27 of the light emission permission unit 26 are connected to the respective signal terminals 24 of the terminal unit 23. In FIG. 5, the permission circuits 27 are connected to the respective signal terminals 24 by wires drawn out from the signal terminals 24.

The light emission permission unit 26 is provided with a reference voltage line 73 to which a reference voltage is supplied and a power supply voltage line 74 to which a power supply voltage VLD is supplied. The reference voltage line 73 is connected to the reference voltage terminal 28. The power supply voltage line 74 is connected to the electrode for light emission 72. As described earlier, the power supply voltage VLD is supplied to the electrode for light emission 72.

The light-emitting units 22 of the light output unit 21 are connected to the permission circuits 27 of the light emission permission unit 26. The permission circuits 27 of the light emission permission unit 26 are connected to the signal terminals 24 of the terminal unit 23. The light-emitting units 22 of the light output unit 21 are permitted to emit light by the permission circuits 27 of the light emission permission unit 26 based on the permission signals φf received by the signal terminals 24 of the terminal unit 23.

Figure 6:
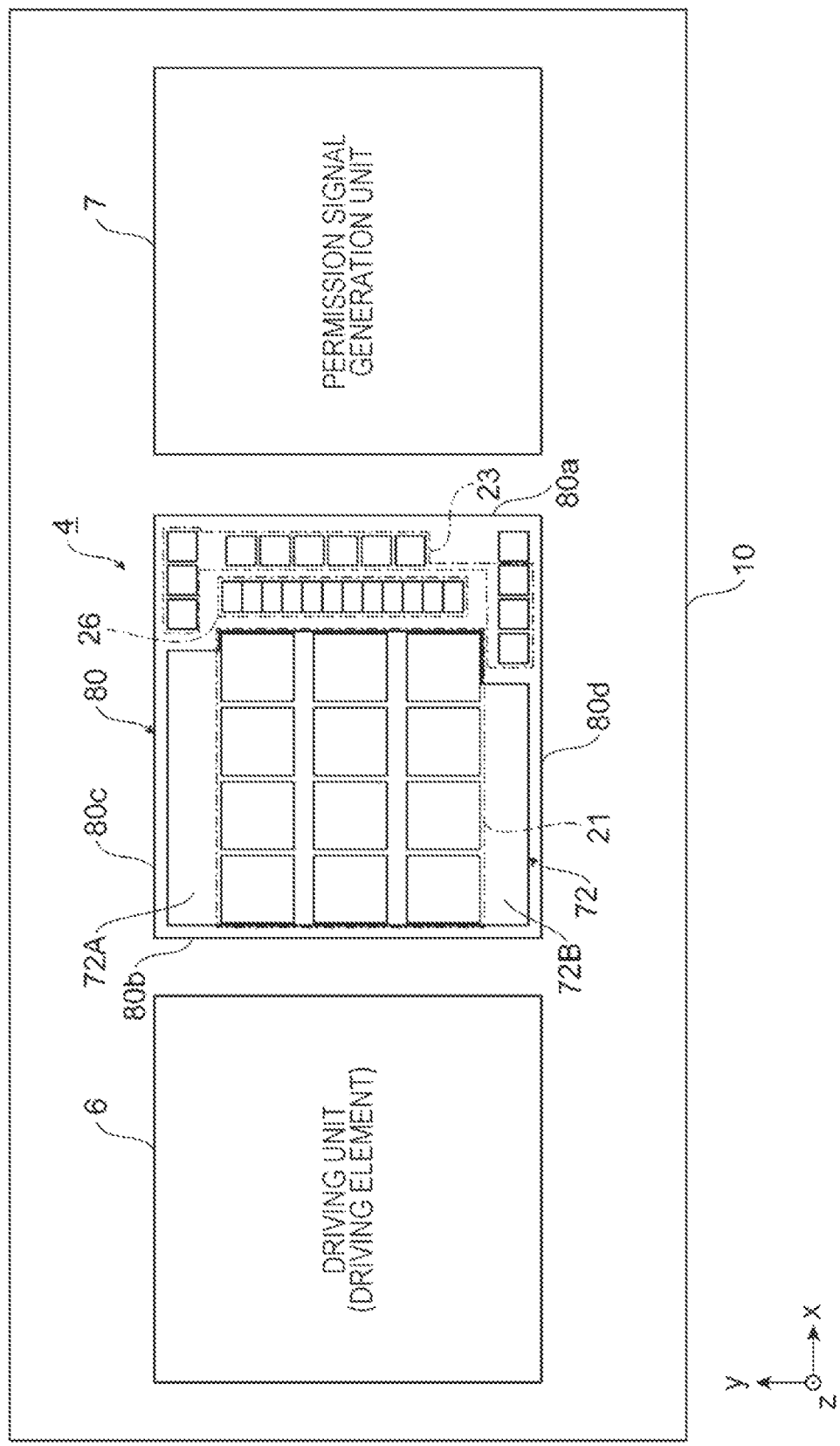
FIG. 6 is a view for explaining a way in which the light-emitting device, a driving unit, and a permission signal generation unit are disposed on a wiring substrate.

FIG. 6 is a view for explaining a way in which the light-emitting device 4, the driving unit 6, and the permission signal generation unit 7 are disposed on the wiring substrate 10. The light-emitting device 4 illustrated in FIG. 6 is a simplified version of that illustrated in the layout diagram of FIG. 4. The x direction, the y direction, and the z direction in FIG. 6 are similar to those in FIGS. 3 and 4.

The driving unit 6 is provided on a side surface 80b side (−x direction side) of the light-emitting device 4 on the substrate 80, and the permission signal generation unit 7 is provided on a side surface 80a (+x direction side) of the light-emitting device 4 on the substrate 80. That is, the driving unit 6 is provided on the light output unit 21 side of the light-emitting device 4. This shortens a distance between the driving unit 6 and the light-emitting units 22 of the light output unit 21, thereby reducing inductance between the driving unit 6 and the light-emitting units 22 of the light-emitting device 4. As a result, a rise time of light pulse is shortened.

The permission signal generation unit 7 is provided on the terminal unit 23 side of the light-emitting device 4. This shortens a distance between the permission signal generation unit 7 and the terminal unit 23, thereby making connection easy.

Furthermore, the pad unit 72A of the electrode for light emission 72 is provided on a side surface 80c side (+y direction side) on the substrate 80, and the pad unit 72B is provided on a side surface 80d side (−y direction side) on the substrate 80. Wires that supply the power supply voltage VLD to the pad units 72A and 72B extend from side surfaces where the driving unit 6 and the permission signal generation unit 7 are not provided. Note that if the pad units 72A and 72B are provided on the side where the terminal unit 23 or the driving unit 6 is provided, connection of the wires to the pad units 72A and 72B may be undesirably hindered by the terminal unit 23 or the driving unit 6. That is, the wires that supply the power supply voltage VLD to the pad units 72A and 72B are provided without being hindered by the driving unit 6 and the permission signal generation unit 7. That is, connection to the pad units 72A and 72B is easier than that in a case where the pad units 72A and 72B are provided at a position where the terminal unit 23 or the driving unit 6 is provided.

The pad unit 72A is provided on the side surface 80c side, and the pad unit 72B is provided on the side surface 80d side. That is, the pad units 72A and 72B are provided on sides corresponding to two opposing side surfaces of the substrate 80. However, any one of the pad units 72A and 72B may be provided. Note that in a case where the pad units 72A and 72B are provided on sides corresponding to two side surfaces of the substrate 80, a current for light emission is supplied from both sides of the electrode for light emission 72. This suppresses unevenness in current supply to the light-emitting units 22 as compared with a case where any one of the pad units 72A and 72B is provided.

Figure 7:
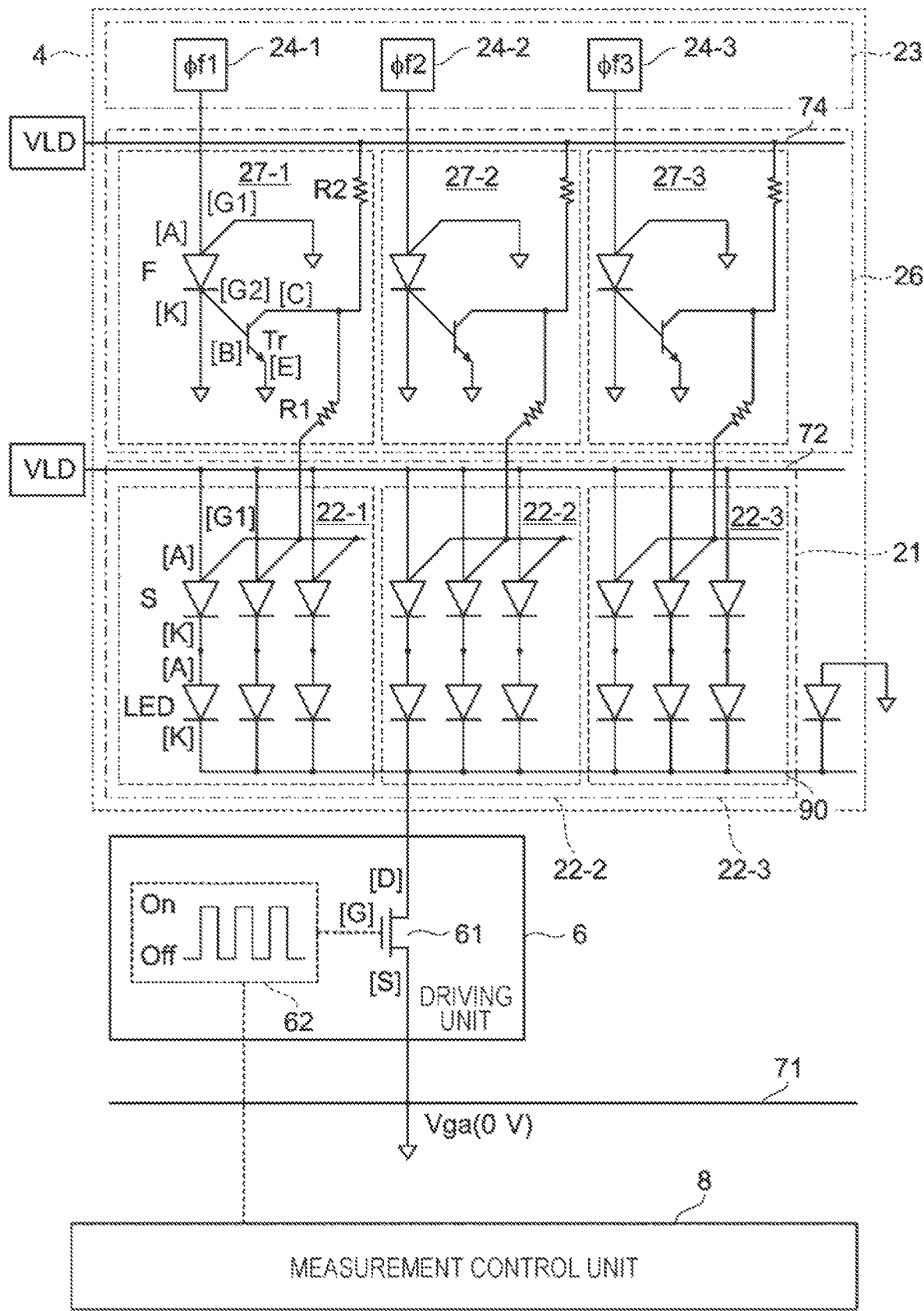
FIG. 7 illustrates an equivalent circuit of the light-emitting device to which the present exemplary embodiment is applied.

FIG. 7 illustrates an equivalent circuit of the light-emitting device 4 to which the present exemplary embodiment is applied. In FIG. 7, the driving unit 6 and the measurement control unit 8 are illustrated in addition to the light-emitting device 4.

The light-emitting device 4 includes the light output unit 21, the terminal unit 23, and the light emission permission unit 26. In FIG. 7, three light-emitting units 22 (light-emitting units 22-1, 22-2, and 22-3) of the light output unit 21, three permission circuits 27 (permission circuits 27-1, 27-2, and 27-3) connected to the three light-emitting units 22, and signal terminals 24 (signal terminals 24-1, 24-2, and 24-3) connected to the three permission circuits 27 are illustrated. These are described below in order.

Each of the light-emitting units 22 includes plural light-emitting diodes LED and plural driving thyristors S that are connected in series (see the light-emitting unit 22-1). The light-emitting diodes LED and the driving thyristors S are an example of a light-emitting element having a thyristor function. Semiconductor layers that constitute the light-emitting diodes LED of each of the light-emitting units 22 are continuous with one another. Similarly, semiconductor layers that constitute the driving thyristors S of each of the light-emitting units 22 are continuous with one another. Accordingly, the driving thyristors S may operate as a single driving thyristor S.

The light-emitting diodes LED are desirably surface light-emitting diodes that emit light in a direction orthogonal to the substrate 80. The surface light-emitting diodes are, for example, vertical cavity surface emitting lasers (VCSELs). In the following description, it is assumed that the light-emitting diodes LED are vertical cavity surface emitting lasers (VCSELs). The vertical cavity surface emitting lasers (VCSELs) are surface emitting laser elements that include a light-emitting layer, which is a light-emitting region, between a lower multilayer reflecting mirror and an upper multilayer reflecting mirror stacked on a substrate and emit laser light in a direction orthogonal to a surface. The vertical cavity surface emitting lasers (VCSELs) have a λ resonator structure. Note that the surface light-emitting diodes may be other light-emitting devices such as laser diodes other than the vertical cavity surface emitting lasers (VCSELs). Hereinafter, the vertical cavity surface emitting lasers (VCSELs) are sometimes referred to as VCSELs.

Each of the light-emitting diodes LED is a two-terminal semiconductor element including a cathode ("K") and an anode ("A"). Each of the driving thyristors S is a three-terminal semiconductor element including a cathode ("K"), an n-gate ("G1"), and an anode ("A").

The anode ("A") of each of the light-emitting diodes LED is connected to the cathode ("K") of a corresponding one of the driving thyristors S. The cathodes ("K") of the driving thyristors S are connected in parallel, and the gates ("G1") of the driving thyristors S are connected in parallel. The cathodes ("K") of the light-emitting diodes LED are connected in parallel. Specifically, the cathodes ("K") of the light-emitting diodes LED are connected to a rear-surface electrode 90 provided on a rear surface of the substrate 80 (see FIG. 11, which will be described later).

The anodes ("A") of the driving thyristors S are connected to the electrode for light emission 72. The power supply voltage VLD is applied to the electrode for light emission 72.

Each of the permission circuits 27 includes a light emission permission thyristor F, an npn bipolar transistor Tr, and resistors R1 and R2 (see the permission circuit 27-1). The light emission permission thyristor F is a four-terminal semiconductor element including a cathode ("K"), an n-gate ("G1"), a p-gate ("G2"), and an anode ("A"). The npn bipolar transistor Tr is a three-terminal semiconductor element including a collector ("C"), a base ("B"), and an emitter ("E").

The reference voltage Vga (0 V) is supplied to the cathode ("K") and the n-gate ("G1") of the light emission permission thyristor F. The anode ("A") of the light emission permission thyristor F is connected to a corresponding one of the signal terminals 24. The permission signal φf is supplied to each of the signal terminals 24. The p-gate ("G2") of the light emission permission thyristor F is connected to the base ("B") of the npn bipolar transistor Tr.

The reference voltage Vga (0 V) is supplied to the emitter ("E") of the npn bipolar transistor Tr. The collector ("C") of the npn bipolar transistor Tr is connected to the n-gates ("G1") of the driving thyristors S of the light-emitting unit 22 with the resistor R1 interposed therebetween. Furthermore, the collector ("C") of the npn bipolar transistor Tr is connected to the power supply voltage line 74 (see FIG. 5) with the resistor R2 interposed therebetween. The power supply voltage VLD is supplied to the power supply voltage line 74.

The driving unit 6 includes an MOS transistor 61 as an example of a driving element and a signal generation circuit 62. Note that the driving element may be an insulated gate bipolar transistor (IGBT) or the like.

A drain ("D") of the MOS transistor 61 is connected to the cathodes ("K") of the light-emitting diodes LED of the light-emitting units 22. The drain ("D") of the MOS transistor 61 is connected to a reference voltage line 71 of the reference voltage Vga (0 V).

The signal generation circuit 62 of the driving unit 6 supplies an On signal (On) for turning the MOS transistor 61 on and an Off signal (Off) for turning the MOS transistor 61 off to the gate ("G") of the MOS transistor 61.

The power supply voltage VLD and the reference voltage Vga (0 V) are supplied from the measurement control unit 8. The driving unit 6 is controlled by the measurement control unit 8.

A driving method of the light-emitting device 4 is low-side driving. The low-side driving is desirable for higher-speed driving of the light-emitting diodes LED. The low-side driving refers to a configuration in which a driving element such as the MOS transistor 61 is located on a downstream side of a current path relative to a driving target such as the light-emitting diodes LED.

Operation of the light-emitting device 4 is described below.

Driving Thyristor S and Light Emission Permission Thyristor F

Each of the driving thyristors S is a semiconductor element having three terminals: the anode ("A"), the n-gate ("G1"), and the cathode ("K"). The light emission permission thyristor F is a semiconductor element having four terminals: the cathode ("K"), the n-gate ("G1"), the A-gate ("G2"), and the anode ("A"). As described later, the driving thyristor S and the light emission permission thyristor F are each configured such that an n-cathode layer 85, a p-gate layer 86, an n-gate layer 87, and a p-anode layer 88 made of a material such as GaAs, AlGaAs, or AlAs are stacked (see FIG. 11, which will be described later). That is, both of the driving thyristor S and the light emission permission thyristor F have an npnp structure. The driving thyristor S does not use the p-gate ("G2"), but the structure of the driving thyristor S is identical to the light emission permission thyristor F. Hereinafter, the driving thyristor S and the light emission permission thyristor F are described as a thyristor.

The following describes, as an example, a case where a forward voltage (diffusion potential) $V_d$ of a pn junction between a p-type semiconductor layer (the p-gate layer 86, the p-anode layer 88) and an n-type semiconductor layer (the n-cathode layer 85, the n-gate layer 87) is 1.5 V.

It is assumed that the thyristor is in an off state in which no current is flowing although a voltage by which the thyristor can shift from the off state to an on state is being applied between the anode ("A") and the cathode ("K"). Note that it is assumed that a voltage $V_K$ of the cathode ("K") of the thyristor is the reference voltage Vga (0 V). When a bias between the anode ("A") and the n-gate ("G1") becomes a forward bias, the thyristor shifts from the off state to the on state in which a current flows (turns on). That is, when a voltage $V_{G1}$ of the n-gate ("G1") becomes lower than a voltage obtained by subtracting the forward voltage $V_d$ from the voltage $V_A$ of the anode ("A") of the thyristor ($V_{G1} < V_A - V_d$), the thyristor turns on.

Furthermore, when the voltage $V_A$ of the anode ("A") of the thyristor becomes higher than a voltage obtained by adding the forward voltage $V_d$ to the voltage $V_{G1}$ of the n-gate ("G1") ($V_A > V_{G1} + V_d$), the thyristor shifts from the off state to the on state (turns on).

The thyristor that is in the on state maintains the on state in a case where the voltage between the anode ("A") and the cathode ("K") is higher than the forward voltage $V_d$ and a current for maintaining the on state is supplied. That is, when the cathode ("K") has the reference voltage Vga (0 V), the on state is maintained in a case where the voltage $V_A$ of the anode ("A") is higher than the forward voltage $V_d$ ($V_A > V_d$). A voltage $V_{G2}$ of the p-gate ("G2") becomes a voltage close to the voltage of the anode ("A"). In the following description, it is assumed that the voltage $V_{G2}$ of the p-gate ("G2") becomes the voltage of the anode ("A") ($V_{G2} = V_A$). Hereinafter, voltages of the anodes ("A") of the light emission permission thyristor F and the driving thyristor S are referred to as voltages $V_{FA}$ and $V_{SA}$, respectively, in order to distinguish them. The same applies to other voltages.

Note that the voltage between the anode ("A") and the cathode ("K") becomes less than the forward voltage $V_d$ while the thyristor is in the on state, the thyristor shifts from the on state to the off state (turns off). Even in a case where the voltage $V_{G1}$ of the gate ("G1") is less than a voltage obtained by subtracting the forward voltage $V_d$ from the voltage $V_A$ of the anode ("A") while the thyristor is in the on state, the thyristor does not turn off.

npn Bipolar Transistor Tr

The npn bipolar transistor Tr that is in an off state shifts to an on state when a bias between the emitter ("E") and the base ("B") becomes a forward bias. This causes the voltage $V_C$ of the collector ("C") to become close to a voltage $V_E$ of the emitter ("E"). In the npn bipolar transistor Tr illustrated in FIG. 7, the reference voltage Vga (0 V) is supplied to the emitter ("E"). Accordingly, when the npn bipolar transistor Tr shift to the on state, the voltage $V_C$ of the collector ("C") becomes close to the reference voltage Vga (0 V), which is the voltage $V_E$ of the emitter ("E"). In the following description, it is assumed that the voltage $V_C$ of the collector ("C") becomes the reference voltage Vga (0 V) ($V_C$=0 V).

Light-Emitting Diode LED

Each of the light-emitting diodes LED is a semiconductor element having two terminals: the anode ("A") and the cathode ("K"). Accordingly, the light-emitting diode LED emits light when a voltage higher than the forward voltage $V_d$ is applied between the anode ("A") and the cathode ("K") and a current that enables light emission flows.

Operation of Light-Emitting Units 22 and Permission Circuits 27

Operation of the light-emitting units 22 and the permission circuits 27 is described by using the light-emitting unit 22-1 and the permission circuit 27-1.

The n-gates ("G1") of the driving thyristors S of the light-emitting unit 22 are connected to the collector ("C") of the npn bipolar transistor Tr of the permission circuit 27 with the resistor R1 interposed therebetween.

The power supply voltage VLD is applied to the anodes ("A") of the driving thyristors S of the light-emitting unit 22 through the electrode for light emission 72. The power supply voltage VLD is applied to the collector ("C") of the npn bipolar transistor Tr of the permission circuit 27 through the resistor R2. The anode ("A") of the light emission permission thyristor F of the permission circuit 27 is connected to the signal terminal 24 and receives the permission signal φf.

It is assumed that the power supply voltage VLD is 5 V and the permission signal φf is 0 V. The power supply voltage VLD of 5 V is higher than the forward voltage $V_d$, which is 1.5 V. It is assumed that the driving thyristors S of the light-emitting unit 22 and the npn bipolar transistor Tr and the light emission permission thyristor F of the permission circuit 27 are in an off state. Furthermore, it is assumed that the signal generation circuit 62 of the driving unit 6 is supplying an On signal to the MOS transistor 61. That is, the MOS transistor 61 is in an on state, and the cathodes ("K") of the light-emitting diode LED connected through the MOS transistor 61 is the reference voltage Vga (0 V).

In a case where the permission signal φf is 0 V, the light emission permission thyristor F maintains the off state since the voltage $V_{FA}$ of the anode ("A") and the voltage $V_{FG1}$ of the n-gate ("G1") of the light emission permission thyristor F of the permission circuit 27 are 0 V.

The power supply voltage VLD is applied to the n-gates ("G1") of the driving thyristors S of the light-emitting unit 22 through the resistor R1 and the resistor R2. The driving thyristors S maintain the off state since the voltage $V_{SA}$ of the anodes ("A") and the voltage $V_{SG1}$ of the n-gates ("G1") of the driving thyristors S are the power supply voltage VLD. Since no current is flowing through the driving thyristors S and the light-emitting diodes LED that are connected in series, the light-emitting diodes LED are not emitting light (non-light-emission state).

When the permission signal φf becomes higher than 1.5 V, which is the forward voltage $V_d$, the voltage $V_{FA}$ of the anode ("A") of the light emission permission thyristor F becomes higher than a voltage obtained by adding the forward voltage $V_d$ to the voltage $V_{FG1}$ (0 V) of the n-gate ("G1") ($V_{FA} > V_{FG1} + V_d$). This causes the light emission permission thyristor F to shift from the off state to the on state (turns on). As a result, the voltage $V_{FG2}$ of the p-gate ("G2") of the light emission permission thyristor F becomes the voltage $V_{FA}$ of the anode ("A") of the light emission permission thyristor F. Since the voltage $V_{FA}$ is higher than 1.5 V, which is the forward voltage $V_d$ ($V_{FA} > V_d$), the npn bipolar transistor Tr shifts from the off state to the on state. As a result, the voltage $V_C$ of the collector ("C") of the npn bipolar transistor Tr becomes the voltage (0 V) of the emitter ("E") ($V_C$=0 V).

The n-gates ("G1") of the driving thyristors S are connected to the collector ("C") of the npn bipolar transistor Tr with the resistor R1 interposed therebetween. When the voltage $V_C$ of the collector ("C") of the npn bipolar transistor Tr becomes 0 V, the voltage $V_{SG1}$ of the n-gates ("G1") of the driving thyristors S becomes 0 V. The voltage $V_{SA}$ of the anodes ("A") of the driving thyristors S is the power supply voltage VLD (5 V). Since the voltage $V_{SG1}$ of the n-gates ("G1") is higher than a voltage that is higher than the voltage $V_{SA}$ of the anode ("A") by the forward voltage $V_d$ ($V_{SG1} > V_{SA} + V_d$), the driving thyristors S shift from the off state to the on state (turns on). As a result, a current flows through the driving thyristors S and the light-emitting diodes LED that are connected in series, and the light-emitting diodes LED start light emission (turn on). Note that 3.5 V obtained by subtracting the forward voltage $V_d$ from the power supply voltage VLD is applied between the anode ("A") and the cathode ("K") of each of the light-emitting diodes LED.

When the permission signal φf, that is, the voltage $V_{FA}$ of the anode ("A") of the light emission permission thyristor F becomes less than the forward voltage $V_d$ ($V_{FA} < V_d$), the light emission permission thyristor F shifts from the on state to the off state (turns off).

Meanwhile, the voltage $V_{SA}$ of the anodes ("A") of the driving thyristors S is the power supply voltage VLD. Accordingly, even in a case where the n-gates ("G1") becomes less than a voltage obtained by subtracting the forward voltage $V_d$ from the voltage $V_{SA}$ of the anode ("A"), the driving thyristors S do not turn off. Accordingly, the signal generation circuit 62 of the driving unit 6 supplies an Off signal and turn the MOS transistor 61 off, and thereby the current flowing through the driving thyristors S and the light-emitting diodes LED that are connected in series is blocked. As a result, the driving thyristors S shift to the off state. Since no current flows through the light-emitting diodes LED, the light-emitting diodes LED stop light emission (turn off) and shift to a non-light-emission state.

In the above description, it is assumed that the power supply voltage VLD is 5 V. The same applies also to a case where the power supply voltage VLD is 10 V. Since the voltage $V_{FG1}$ of the n-gate ("G1") of the light emission permission thyristor F is the reference voltage Vga (0 V), the light emission permission thyristor F turns on when the permission signal φf becomes higher than 1.5 V, which is the forward voltage $V_d$. When the permission signal φf becomes equal to or lower than 1.5 V, which is the forward voltage $V_d$, the light emission permission thyristor F turns off and maintains the off state. That is, irrespective of the power supply voltage VLD, the light emission permission thyristor is turned on when the permission signal φf is set to a voltage higher than 1.5 V, which is the forward voltage $V_d$, and the light emission permission thyristor turns off or maintains the off state when the permission signal φf is set to a voltage less than 1.5 V. Accordingly, global parallel I/O (GPIO) or the like that outputs a voltage such as 1.8V, 3V, or 3.3V can be applied as the permission signal generation unit 7 that supplies the permission signal φf.

Note that in a case where the power supply voltage VLD is 5 V, 3.5 V is applied to the light-emitting diodes LED, whereas in a case where the power supply voltage VLD is 10 V, 8.5 V is applied to the light-emitting diodes LED. A light intensity of the light-emitting diodes LED becomes higher as the applied voltage becomes higher. Accordingly, a higher power supply voltage VLD is more desirable, and the voltage of the permission signal φf is required to be low. Therefore, by providing the light emission permission unit 26, the voltage of the permission signal φf is set low irrespective of the power supply voltage VLD.

The power supply voltage VLD is an example of a first voltage, and the voltage of the permission signal φf for shifting the light emission permission thyristor F to an on state is an example of a second voltage. As described above, the power supply voltage VLD, which is an example of a first voltage, is, for example, 5 V or 10 V, and the voltage of the permission signal φf for shifting the light emission permission thyristor F to an on state, which is an example of a second voltage, is higher than 1.5 V, which is the forward voltage $V_d$. Accordingly, the second voltage is set lower than the first voltage. The permission signal generation unit 7 is an example of a member that supplies the second voltage.

Note that the right end of FIG. 7 illustrates a light-emitting diode LED whose anode ("A") is set to the reference voltage Vga (0 V). The light emission permission unit 26 is provided on the light-emitting diodes LED, as described later. Accordingly, the anodes ("A") of the light-emitting diodes LED are set to the reference voltage Vga (0 V). As a result, when the MOS transistor 61 of the driving unit 6 shifts to an on state, the light-emitting diodes LED do not emit light since the rear-surface electrode 90, which is the cathodes ("K") of the light-emitting diodes LED, becomes the reference voltage Vga (0 V).

Figure 8:
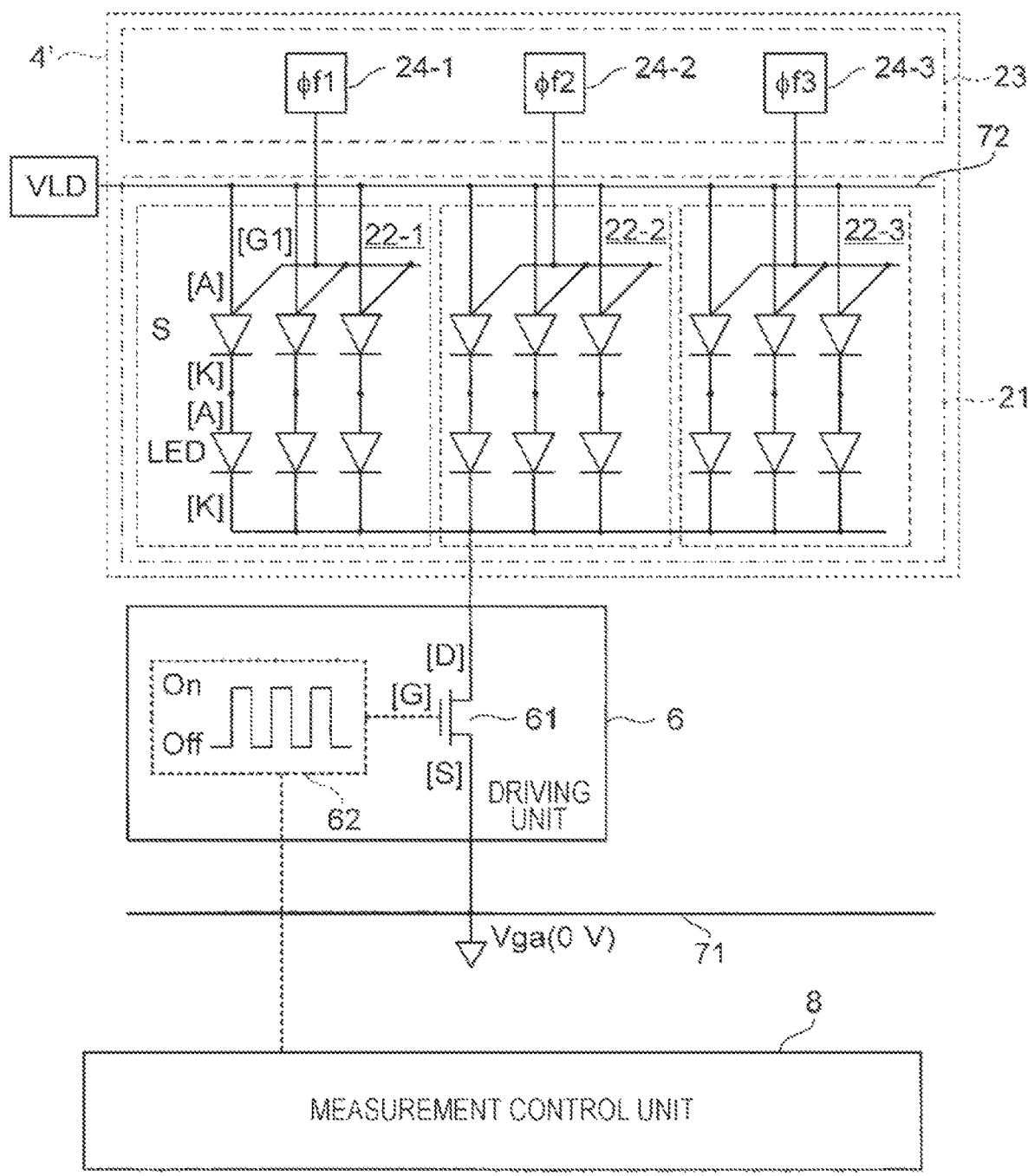
FIG. 8 illustrates an equivalent circuit of a light-emitting device to which the present exemplary embodiment is not applied.

FIG. 8 illustrates an equivalent circuit of a light-emitting device 4' to which the present exemplary embodiment is not applied. In FIG. 8, the driving unit 6 and the measurement control unit 8 are illustrated in addition to the light-emitting device 4'. The light-emitting device 4' does not include the light emission permission unit 26. The signal terminals 24 of the terminal unit 23 are connected to the n-gates ("G1") of the driving thyristors S of the light-emitting units 22. The permission signal φf is supplied to the signal terminals 24. Other parts of the light-emitting device 4' are similar to those of the light-emitting device 4 illustrated in FIG. 7 and are given identical reference signs, and description thereof is omitted.

In the light-emitting device 4', the voltage $V_{SA}$ of the anodes ("A") of the driving thyristors S is the power supply voltage VLD. When the voltage $V_{SG1}$ of the n-gates ("G1"), which is the permission signal φf, becomes lower than a voltage obtained by subtracting the forward voltage $V_d$ from the voltage $V_{SA}$ of the anode ("A") ($V_{SG1} < V_A - V_d$), the driving thyristor S shifts from an off state to an on state (turns on). Accordingly, in a case where the power supply voltage VLD is 5 V, the voltage of the permission signal φf is required to be equal to or higher than 3.5 V in order to maintain an off state of the driving thyristors S. In a case where the power supply voltage VLD is 10 V, the voltage of the permission signal φf is required to be equal to or higher than 8.5 V in order to maintain an off state of the driving thyristors S. It is therefore hard to apply global parallel I/O (GPIO) as the permission signal generation unit 7 of the light-emitting device 4'.

Timing Diagram of Light-Emitting Device 4

FIG. 9 is a timing diagram for explaining operation of the light-emitting device 4. The horizontal axis represents a time t, which elapses in an order of times a to e. FIG. 9 illustrates the power supply voltage VLD, the permission signals φf1 to φf8, the permission signals φf9 to φf12, a signal of the signal generation circuit 62 of the driving unit 6, states of the light-emitting units 22-1 to 22-8, and states of the light-emitting units 22-9 to 22-12 from up to down. The permission signals φf1 to φf12 are signals switched between an H level and an L level. Note that the H level is a voltage higher than the forward voltage $V_d$, and the L level is the reference voltage Vga (0 V). It is, for example, assumed that the permission signals φf1 to φf8 are maintained at the L level, and the permission signals φf9 to φf12 are concurrently switched from the L level to the H level and then to the L level. Note that each of the permission signals φf1 to φf12 may be independently set or plural permission signals may be set concurrently as described above. Alternatively, all of the permission signals φf1 to φf12 may be set concurrently.

At the time a, the power supply voltage VLD is applied. The permission signals φf1 to φf12 are at the L level. Accordingly, the light emission permission thyristors F of the permission circuits 27-1 to 27-12 are in an off state. The signal generation circuit 62 of the driving unit 6 is supplying an Off signal to the MOS transistor 61. Accordingly, the MOS transistor 61 is in an off state. All of the driving thyristors S are in an off state, and all of the light-emitting diodes LED are in a non-light-emission state.

At the time b, the permission signals φf9 to φf12 shift from the L level to the H level. This causes the light emission permission thyristors F of the permission circuits 27-9 to 27-12 to turn on. As a result, the n-gates ("G1") of the driving thyristors S of the light-emitting units 22-9 to 22-12 become 0 V through the npn bipolar transistor Tr, so that the driving thyristors S become capable of shifting from an off state to an on state. However, the driving thyristors S cannot shift to an on state since the MOS transistor 61 of the driving unit 6 is in an off state.

At the time c, the signal generation circuit 62 of the driving unit 6 supplies an On signal to the MOS transistor 61. Accordingly, the power supply voltage VLD is applied to the serial connection between the driving thyristors S and the light-emitting diodes LED of the light-emitting units 22-9 to 22-12. As a result, the driving thyristors S shift from an off state to an on state, and the light-emitting diodes LED start light emission (turn on).

At the time d, the permission signals φf9 to φf12 shift from the H level to the L level. This causes the light emission permission thyristors F in the permission circuits 27-9 to 27-12 to turn off. However, the driving thyristors S of the light-emitting units 22-9 to 22-12 do not shift to an off state, and the light-emitting diodes LED continue light emission.

At the time e, the signal generation circuit 62 of the driving unit 6 supplies an Off signal to the MOS transistor 61. As a result, a current no longer flows through the serial connection between the driving thyristors S and the light-emitting diodes LED of the light-emitting units 22-9 to 22-12, and the light-emitting diodes LED stop light emission (turn off).

As described above, the light-emitting device 4 is controlled. Note that a timing at which the permission signals φf9 to φf12 shift from the L level to the H level at the time b and a timing at which the signal generation circuit 62 of the driving unit 6 supplies an On signal to the MOS transistor 61 at the time c may be exchanged. In this case, the light-emitting diodes LED start light emission at the timing at which the permission signals φf9 to φf12 shift from the L level to the H level. Furthermore, a timing at which the permission signals φf9 to φf12 shift from the H level to the L level at the time d and a timing at which the signal generation circuit 62 of the driving unit 6 supplies an Off signal to the MOS transistor 61 at the time e may be exchanged.

Structure of Light-Emitting Device 4

The light-emitting device 4 is made of a semiconductor material that can emit light. For example, the light-emitting device 4 is made of a GaAs-based compound semiconductor. The light-emitting device 4 is a semiconductor layer multilayer body in which plural GaAs-based compound semiconductor layers are stacked on an n-type GaAs substrate 80, as illustrated in a cross-sectional view described later (see FIG. 11, which will be described later). The light-emitting device 4 is configured such that the semiconductor layer multilayer body is separated into plural island shapes. Note that regions remaining in island shapes are referred to as islands. Etching the semiconductor layer multilayer body into island shapes to provide separate elements is referred to as mesa etching.

Structures of the light-emitting units 22 and the permission circuits 27 are described below in order.

Structure of Light-Emitting Units 22

The light-emitting units 22 are provided in islands 301 into which the semiconductor multilayer body has been separated. Note that the islands 301 corresponding to the light-emitting units 22-1, 22-2, . . . are referred to as islands 301-1, 301-2, . . . , respectively.

FIG. 10 is an enlarged plan view of the light-emitting unit 22. FIG. 10 a partially enlarged view of the light-emitting unit 22-12 (the island 301-12) in the light-emitting device 4 illustrated in FIG. 5. In the following description, the light-emitting unit 22-12 is referred to as the light-emitting unit 22, and the island 301-12 is referred to as the island 301. FIG. 10 also illustrates an island 302. The x direction, the y direction, and the z direction in FIG. 10 are similar to those in FIG. 5.

The island 301 includes the plural light-emitting diodes LED and the plural driving thyristors S. In FIG. 10, four light-emitting diodes are given reference signs LED1 to LED4, respectively, and driving thyristors that surround the light-emitting diodes LED1 to LED4 are given reference signs S1 to S4, respectively.

First, a planar structure of the light-emitting unit 22 is described by focusing on the light-emitting diode LED1 and the driving thyristor S1 located in a lower right portion of the paper on which FIG. 10 is drawn. Note that the light-emitting diode LED1 and the setting thyristor S1 are referred to as the light-emitting diode LED and the setting thyristor S without distinction. The same applies hereinafter.

A central circular portion of the light-emitting diode LED is a light emission opening 341 of the light-emitting diode LED. The driving thyristor S is a region 311 (see FIG. 11, which will be described later) of a p-type anode layer (hereinafter referred to as a p-anode layer, the same applies to others) provided so as to surround the light emission opening 341. A p-ohmic electrode 321 is provided on the region 311. Furthermore, six holes (trenches) 342 and six n-gate electrodes 331 are provided outside the p-ohmic electrode 321. The n-gate electrodes 331 are provided on an n-type gate layer (n-gate layer) 87, which will be described later. Note that the n-gate electrodes 331 includes an n-gate electrode 331 that is continuous with an n-gate electrode 331 of an adjacent light-emitting diode LED.

The n-gate layer 87 is drawn out to a light emission permission unit 26 side (+x direction side), and an n-gate electrode 332 connected to the permission circuit 27 (the permission circuit 27-12 in the case of the island 301-12) is provided at an end thereof. Note that a part of the n-gate layer 87 drawn out to the light emission permission unit 26 side is the wire 25 (the wire 25-12 in this case).

The electrode for light emission 72 is provided so as to cover the light-emitting unit 22 except for the light emission opening 341. The electrode for light emission 72 is connected to the p-ohmic electrode 321 provided on the region 311 through a through-hole provided in an insulating layer 89 (see FIGS. 11A and 11B, which will be described later). In FIG. 10, the electrode for light emission 72 is indicated by the broken line.

The island 302 is provided so that the n-gate layer 87 is exposed, and an n-gate electrode 333 is provided on the exposed n-gate layer 87. An end of the n-gate electrode 333 in the island 302 is connected to the electrode for light emission 72 through a through-hole provided in the insulating layer 89. The other end of the n-gate electrode 333 in the island 302 is connected to the power supply voltage line 74 illustrated in FIG. 5. That is, the island 302 supplies the power supply voltage VLD to the power supply voltage line 74 by the n-gate layer 87 and the n-gate electrode 333. In the present exemplary embodiment, the n-gate electrode 333 is an example of a supply electrode.

FIGS. 11A and 11B are cross-sectional views of the light-emitting unit 22. FIG. 11A is a cross-sectional view taken along line XIA-XIA in FIG. 10, and FIG. 11B is a cross-sectional view taken along line XIB-XIB in FIG. 10. FIG. 11A is a cross-sectional view of a portion where the two light-emitting diodes LED1 and LED2 that are adjacent to each other with the n-gate electrode 331 interposed therebetween are provided. FIG. 11B is a cross-sectional view of a portion where the two light-emitting diodes LED3 and LED4 that are adjacent to each other with the hole 342 interposed therebetween are provided.

As illustrated in FIG. 11A, the light-emitting unit 22 is configured such that an n-type cathode layer (n-cathode layer) 81, a light emission layer 82, and a p-type anode layer (p-anode layer) 83 that constitute the light-emitting diode LED are stacked on the n-type GaAs substrate 80. That is, the light-emitting diode LED is configured such that the n-cathode layer 81 serving as a cathode, the light emission layer 82 serving as a light emission layer, and the p-anode layer 83 serving as an anode are stacked.

Next, a tunnel junction layer 84 is stacked on the p-anode layer 83.

The n-type cathode layer (n-cathode layer) 85, the p-type gate layer (p-gate layer) 86, the n-type gate layer (n-gate layer) 87, and the p-type anode layer (p-anode layer) 88 that constitute the driving thyristor S are stacked on the tunnel junction layer 84. That is, the driving thyristor S is configured such that the n-cathode layer 85 serving as a cathode, the p-gate layer 86 serving as a p-gate, the n-gate layer 87 serving as an n-gate, and the n-gate layer 87 serving as an anode are stacked.

A multilayer body constituted by the n-cathode layer 81, the light emission layer 82, the p-anode layer 83, the tunnel junction layer 84, the n-cathode layer 85, the p-gate layer 86, the n-gate layer 87, and the n-gate layer 87 is the semiconductor layer multilayer body.

The light-emitting diode LED is configured such that the p-anode layer 88, the n-gate layer 87, the p-gate layer 86, the n-cathode layer 85, and the tunnel junction layer 84 of the driving thyristor S stacked on an upper side are removed by etching to expose the p-anode layer 83. That is, light is emitted from the exposed p-anode layer 83. The exposed p-anode layer 83 is the light emission opening 341.

The driving thyristor S is constituted by the n-cathode layer 85, the p-gate layer 86, the n-gate layer 87, and the p-anode layer 88 that remain around the light emission opening 341 of the light-emitting diode LED. The tunnel junction layer 84 and the p-anode layer 83, the light emission layer 82, and the n-cathode layer 81 that constitute the light-emitting diode LED are provided on a substrate 80 side of the driving thyristor S. That is, the light-emitting diode LED and the driving thyristor S are stacked with the tunnel junction layer 84 interposed therebetween and are connected in series.

The tunnel junction layer 84 is provided between the p-anode layer 83 of the light-emitting diode LED and the n-cathode layer 85 of the driving thyristor S. That is, without the tunnel junction layer 84, the p-anode layer 83 of the light-emitting diode LED and the n-cathode layer 85 of the driving thyristor S are in an inverse bias state, and therefore a current is hard to flow from the n-cathode layer 85 of the driving thyristor S to the p-anode layer 83 of the light-emitting diode LED. The tunnel junction layer 84 is a junction of a $P^{++}$ layer doped with a high concentration of p-type impurities on the p-anode layer 83 side of the light-emitting diode LED and an $n^{++}$ layer doped with a high concentration of n-type impurities on the n-cathode layer 85 side of the driving thyristor S. Since a width of a depletion region in the tunnel junction layer 84 is narrow, tunneling of electrons from an $n^{++}$ layer side conduction band to a $p^{++}$ layer side valence band occurs in an inverse bias state. Accordingly, electrons are easy to flow from the n-cathode layer 85 of the driving thyristor S to the p-anode layer 83 of the light-emitting diode LED.

The p-ohmic electrode 321 that makes ohmic contact with the p-anode layer 88 is provided on the p-anode layer 88. The p-ohmic electrode 321 is connected to the electrode for light emission 72 through a through-hole provided in the insulating layer 89.

Furthermore, the n-gate electrode 331 that makes ohmic contact with the n-gate layer 87 exposed by etching a part of the p-anode layer 88 is provided. The n-gate electrode 331 reduces resistance of the exposed n-gate layer 87.

Note that the electrode for light emission 72 and the n-gate electrode 331 are insulated with the insulating layer 89 interposed therebetween.

As illustrated in FIG. 11A, the n-cathode layer 81, the light emission layer 82, the p-anode layer 83, the tunnel junction layer 84, the n-cathode layer 85, the p-gate layer 86, the n-gate layer 87, and the p-anode layer 88 are continuous between the light emission opening 341 of the light-emitting diode LED1 and the light emission opening 341 of the light-emitting diode LED2 that are adjacent to each other with the n-gate electrode 331 interposed therebetween.

As illustrated in FIG. 11B, the light emission opening 341 of the light-emitting diode LED3 and the light emission opening 341 of the light-emitting diode LED4 are adjacent to each other with the hole 342 interposed therebetween. The hole 342 is provided by removing the p-anode layer 88, the n-gate layer 87, the p-gate layer 86, the n-cathode layer 85, the tunnel junction layer 84, the p-anode layer 83, the light emission layer 82, and the n-cathode layer 81. A current constriction layer contained in the p-anode layer 83 is oxidized through the hole 342, so that a portion close to the hole 342 is turned into a current blocking portion β where a current is hard to flow. Meanwhile, a portion far from the hole 342 remains without being oxidized. That is, the portion that is not oxidized becomes a current passage portion α where a current flows. Plural holes 342 are provided around the light emission opening 341 so as to surround the light emission opening 341. Accordingly, the current passage portion α has a shape close to a circle. The light emission opening 341 is provided corresponding to the current passage portion α. With this configuration, although the n-cathode layer 81, the p-anode layer 83, and the light emission layer 82 are provided continuously in the light-emitting unit 22, the light-emitting diode LED is provided for each light emission opening 341.

Meanwhile, as illustrated in FIG. 11A, the n-cathode layer 85, the p-gate layer 86, the n-gate layer 87, and the p-anode layer 88 that constitute the driving thyristor S are continuous between the light-emitting diodes LED. Accordingly, the driving thyristors S operate for each light-emitting unit 22. A single driving thyristor S may be provided for plural light-emitting diodes LED in the light-emitting unit 22.

Between the light-emitting units 22, that is, between the islands 301, the p-anode layer 88, the n-gate layer 87, the p-gate layer 86, the n-cathode layer 85, the tunnel junction layer 84, the p-anode layer 83, the light emission layer 82, and the n-cathode layer 81 are removed, as in the right end of FIGS. 11A and 11B. That is, the p-anode layer 83, the light emission layer 82, and the n-cathode layer 81 that constitute the light-emitting diode LED and the p-anode layer 88, the n-gate layer 87, the p-gate layer 86, and the n-cathode layer 85 that constitute the driving thyristor S are not continuous between the islands 301. Therefore, light emission is individually controlled for each of the light-emitting units 22.

Structure of Permission Circuit 27

Each of the permission circuits 27 is constituted by islands 303 and 304 that are separated from each other by removing a portion of the semiconductor layer multilayer body to the tunnel junction layer 84 by etching. Note that the islands 303 corresponding to the permission circuits 27-1, 27-2, . . . are referred to as islands 303-1, 303-2, . . . , and the islands 304 corresponding to the permission circuits 27-1, 27-2, . . . are referred to as islands 304-1, 304-2, . . . .

Figure 12:
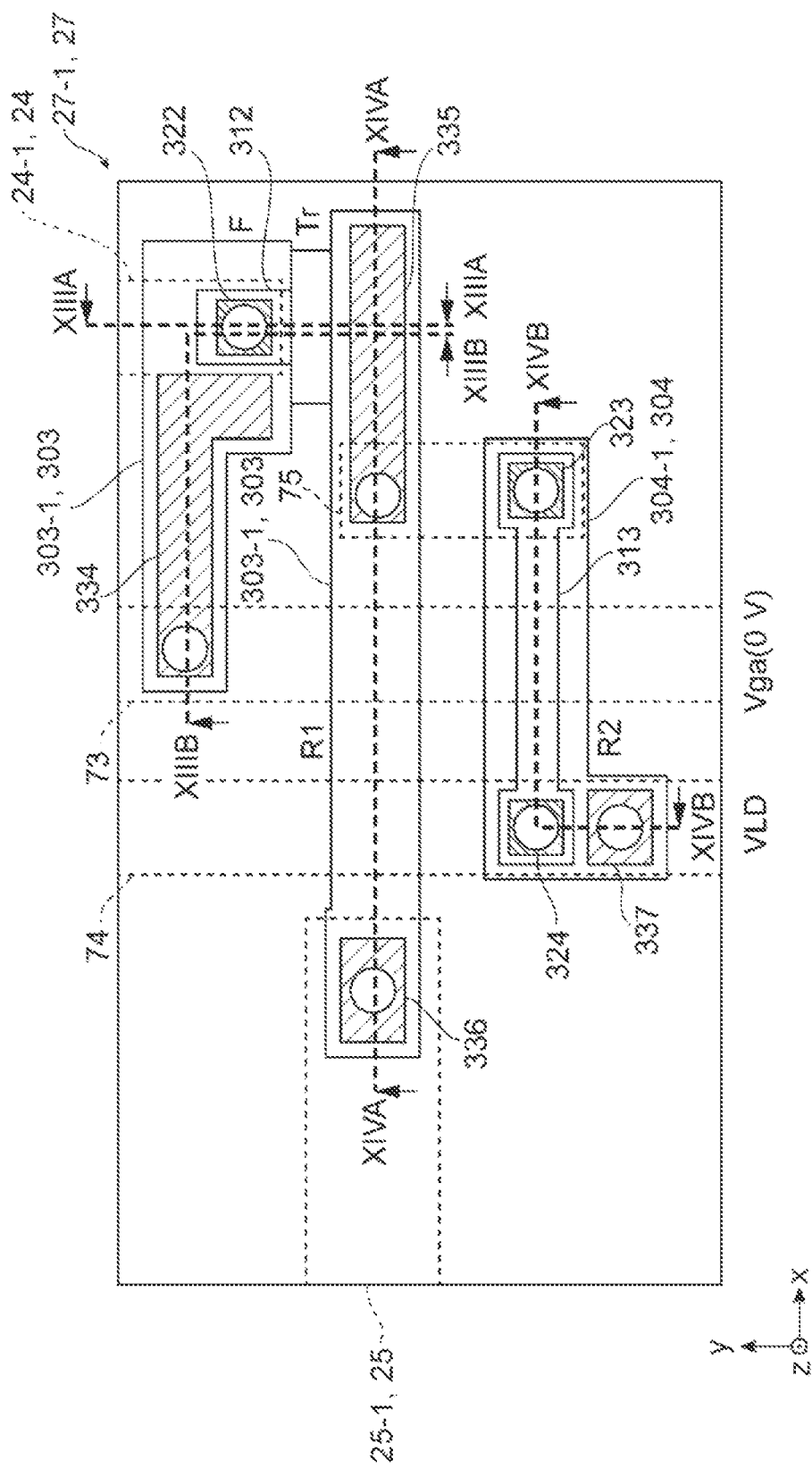
FIG. 12 is a plan view of a permission circuit.

FIG. 12 is a plan view of the permission circuit 27. FIG. 12 illustrates the permission circuit 27-1 (the islands 303-1 and 304-1) in the light-emitting device 4 illustrated in FIG. 5. The islands 303-1 and 304-1 are referred to as islands 303 and 304. The x direction, the y direction, and the z direction in FIG. 12 are similar to those in FIG. 5. Note that the wire 25, the reference voltage line 73, the power supply voltage line 74, and a connection line 75 are indicated by the broken lines, and through-holes provided in the insulating layer 89 for connection to these wires are indicated by the circles.

In the permission circuit 27, the power supply voltage line 74 and the reference voltage line 73 are provided in parallel in the y direction (see FIG. 5). The power supply voltage VLD is supplied to the power supply voltage line 74, and the reference voltage Vga (0 V) is supplied to the reference voltage line 73. Note that the reference voltage line 73 is connected to the reference voltage terminal 28 by an island (not illustrated) similar to the island 302.

The island 303 extends in the x direction from the reference voltage line 73 side. Furthermore, the island 303 is bent in the −y direction and provided toward the −x direction. That is, the island 303 has a mirror-reversed C-shape. The light emission permission thyristor F and the npn bipolar transistor Tr are provided in the island 303.

The light emission permission thyristor F uses a region 312 formed by the p-anode layer 88 as a p-anode. A p-ohmic electrode 322 provided on the region 312 formed by the p-anode layer 88 is connected to the signal terminal 24 (the signal terminal 24-1 in this example) through a through-hole provided in the insulating layer 89. On the −x direction side of the light emission permission thyristor F, an n-gate electrode 334 is provided on the exposed n-gate layer 87. The n-gate electrode 334 is connected to the reference voltage line 73 at an end thereof in the −x direction side.

The npn bipolar transistor Tr is provided on the −y direction side of the light emission permission thyristor F. The n-gate layer 87 on the light emission permission thyristor F side serves as the emitter ("E"), and the n-gate layer 87 on the −y direction side of the light emission permission thyristor F serves as the collector ("C"). The p-gate layer 86 is exposed between the emitter ("E") and the collector ("C"). The exposed p-gate layer 86 serves as the base ("B"). An n-gate electrode 335 is provided on the n-gate layer 87 on the collector ("C") side. Meanwhile, an n-gate electrode 336 is provided on the n-gate layer 87 extending to the −x direction side. The n-gate electrode 336 is connected to the wire 25 (the wire 25-1 in this example) through a through-hole provided in the insulating layer 89. The n-gate layer 87 between the n-gate electrode 335 and the n-gate electrode 336 serves as the resistor R1.

The resistor R2 is provided in the island 304. A region 313 formed by the p-anode layer 88 of the island 304 serves as the resistor R2. At respective ends, in the x direction, of the region 313, p-ohmic electrodes 323 and 324 are provided. The p-ohmic electrode 323 on the x direction side and the n-gate electrode 335 of the island 303 are connected by the connection line 75 through a through-hole provided in the insulating layer 89. The p-ohmic electrode on the −x direction side is connected to the power supply voltage line 74 through a through-hole provided in the insulating layer 89 together with an n-gate electrode 337 provided on the exposed n-gate layer 87 of the island 304.

Figure 13A:
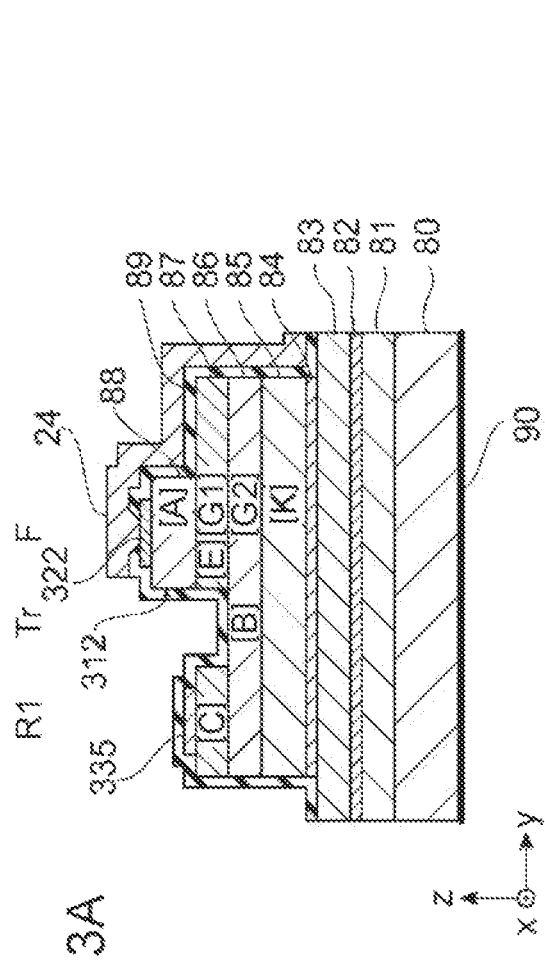
FIGS. 13A and 13B are cross-sectional views of a permission circuit.
Figure 13B:
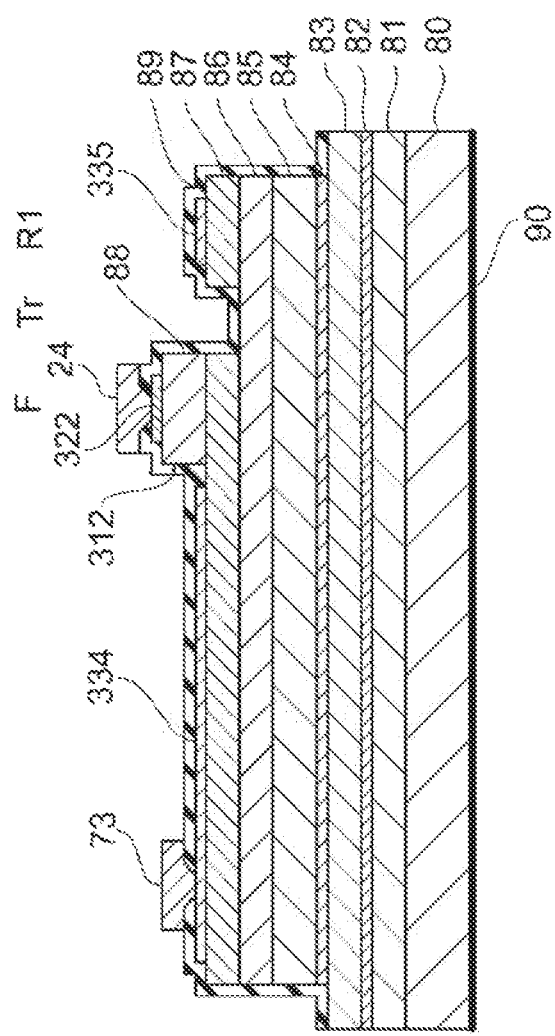

FIG. 13 is a cross-sectional view of the permission circuit 27. FIG. 13A is a cross-sectional view taken along line XIIIA-XIIIA of FIG. 12, and FIG. 13B is a cross-sectional view taken along line XIIIB-XIIIB of FIG. 12. In FIG. 13A, the rightward direction, the frontward direction, and the upward direction on the paper on which FIG. 13A id drawn are the y direction, the x direction, and the z direction, respectively.

As illustrated in FIG. 13A, the light emission permission thyristor F is configured such that the n-cathode layer 85 on the tunnel junction layer 84 serves as the cathode ("K"), the p-gate layer 86 serves as the p-gate ("G2"), the n-gate layer 87 serves as the n-gate ("G1"), and the p-node layer 88 serves as the p-anode ("A"). The npn bipolar transistor Tr is formed by etching so that the A-gate layer 86 is exposed. The npn bipolar transistor Tr is configured such that the n-gate layer 87 serves as the emitter ("E"), the p-gate layer 86 serves as the base ("B"), and the n-gate layer 87 serves as the collector ("C"). That is, the n-gate layer 87, which is the n-gate ("G1") of the light emission permission thyristor F, also serves as the emitter ("E") of the npn bipolar transistor Tr. The p-gate layer 86, which is the p-gate ("G2") of the light emission permission thyristor F, also serves as the base ("B") of the npn bipolar transistor Tr.

As illustrated in FIG. 13B, the n-gate electrode 334 on the n-gate layer 87 is connected to the reference voltage line 73. The n-gate ("G1") of the light emission permission thyristor F and the emitter ("E") of the npn bipolar transistor Tr are set to 0 V by the reference voltage line 73 to which the reference voltage Vga (0 V) is supplied. Note that the p-anode layer 83 of the permission circuit 27 (the light emission permission unit 26), which is an anode of the light-emitting diode LED, is connected to the reference voltage Vga (0 V) (not illustrated).

FIGS. 14A and 14B are other cross-sectional views of the permission circuit 27. FIG. 14A is a cross-sectional view taken along line XIVA-XIVA of FIG. 12, and FIG. 14B is a cross-sectional view taken along line XIVB-XIVB of FIG. 12. In FIG. 14A, the rightward direction, the frontward direction, and the upward direction on the paper on which FIG. 14A is drawn are the y direction, the x direction, and the z direction, respectively.

As illustrated in FIG. 14A, the n-gate layer 87 between the n-gate electrodes 335 and 336 provided on the n-gate layer 87 is the resistor R1.

As illustrated in FIG. 14B, the p-anode layer 88 and the n-gate layer 87 between the p-ohmic electrodes 323 and 324 provided on the p-anode layer 88 are the resistor R2.

Configuration of Semiconductor Layer Multilayer Body

The n-cathode layer 81, the light emission layer 82, and the p-anode layer 83 are semiconductor layers that constitute the light-emitting diode LED, and the n-cathode layer 85, the p-gate layer 86, the n-gate layer 87, and the p-anode layer 88 are semiconductor layers that constitute the driving thyristor S and the permission circuit 27.

These are described below in order.

Substrate 80

Although an example in which the substrate 80 is made of n-type GaAs is described, the substrate 80 may be made of p-type GaAs or may be made of intrinsic (i) GaAs doped with no impurity. Alternatively, the substrate 80 may be a semiconductor substrate made of InP, GaN, InAs, or other III-V group or II-VI materials, sapphire, Si, Ge, or the like. In a case where a different substrate is used, a material that substantially matches (including a strain structure, a strain relaxation layer, and metamorphic growth) a lattice constant of the substrate is used as a material stacked monolithically on the substrate. For example, InAs, InAsSb, GaInAsSb, or the like is used on an InAs substrate, InP, InGaAsP, or the like is used on an InP substrate, GaN, AlGaN, or InGaN is used on a GaN substrate or a sapphire substrate, and Si, SiGe, GaP, or the like is used on a Si substrate. However, in a case where the substrate 80 is electrically insulating, it is necessary to separately provide an electrode that supplies a voltage to the n-cathode layer 81. In a case where the semiconductor layer multilayer body excluding the substrate 80 is attached onto another support substrate, matching with a lattice constant of the support substrate is unnecessary.

Semiconductor Layers Constituting Light-Emitting Diode LED

It is assumed here that the light-emitting diode LED is a VCSEL.

The n-cathode layer 81 constitutes an n-type lower distributed bragg reflector (DBR) in which AlGaAs layers different in Al composition are alternately stacked. The light emission layer 82 is configured as an active region including a quantum well layer sandwiched between an upper spacer layer and a lower spacer layer. The p-anode layer 83 is configured as an upper distributed bragg reflector in which AlGaAs layers different in Al composition are alternately stacked. Hereinafter, the distributed bragg reflector is referred to as a DBR. Light output of a single VCSEL is 4 mW to 8 mW, which is higher than that of other laser diodes.

The n-type lower DBR that constitutes the n-cathode layer 81 is a multilayer body constituted by pairs of an $Al_{0.9}Ga_{0.1}As$ layer and a GaAs layer. The layers of the lower DBR each have a thickness of $\lambda/4n_r$ ($\lambda$ is an oscillation wavelength, and $n_r$ is a refractive index of a medium) and are alternately stacked so that 40 pairs of the layers are stacked. Silicon (Si), which is an n-type impurity, is doped as a carrier. A carrier concentration is, for example, $3\times10^{18}$ cm$^{-3}$.

The lower spacer layer that constitutes the light emission layer 82 is an undoped $Al_{0.6}Ga_{0.4}As$ layer, the quantum well layer is an undoped InGaAs quantum well layer and an undoped GaAs barrier layer, and the upper spacer layer is an undoped $Al_{0.6}Ga_{0.4}As$ layer.

The p-type upper DBR that constitutes the p-anode layer 83 is a multilayer body constituted by pairs of a p-type $Al_{0.9}Ga_{0.1}As$ layer and a GaAs layer. The layers of the upper DBR each have a thickness of $\lambda/4n_r$ and are alternately stacked so that 29 pairs are stacked. Carbon (C), which is a p-type impurity, is doped as a carrier. A carrier concentration is, for example, $3\times10^{18}$ cm$^{-3}$. A p-type AlAs current constriction layer is provided in a bottommost layer or in an inner portion of the upper DBR 208.

The p-type AlAs is higher in oxidation speed than AlGaAs, and an oxidized region is oxidized from a side surface of the hole 342 toward an inner side. Al is oxidized to form $Al_2O_3$. This increases electric resistance, thereby forming the current blocking portion β. Note that the current constriction layer may be any material having a high Al impurity concentration such as p-type AlGaAsGaAs instead of AlAs as long as Al is oxidized to form $Al_2O_3$. The current blocking portion β may be formed by implanting hydrogen ions (H$^+$) in a semiconductor layer such as AlGaAs (H$^+$ Ion Implantation).

Tunnel Junction Layer 84

The tunnel junction layer 84 is a junction of a p$^{++}$ layer doped with a high concentration of p-type impurities and an n$^{++}$ layer doped with a high concentration of n-type impurities. The n$^{++}$ layer and the p$^{++}$ layer have, for example, a high concentration of impurities of $1\times10^{20}$/cm$^3$. Note that an impurity concentration of a normal junction is $10^{17}$/cm$^3$ order to $10^{18}$/cm$^3$ order. A combination of the p$^{++}$ layer and the n$^{++}$ layer (hereinafter referred to as a p$^{++}$ layer/n$^{++}$ layer) is, for example, p$^{++}$GaAs/n$^{++}$GaInP, p$^{++}$AlGaAs/n$^{++}$GaInP, p$^{++}$GaAs/n$^{++}$GaAs, p$^{++}$AlGaAs/n$^{++}$AlGaAs, p$^{++}$InGaAs/n$^{++}$InGaAs, p$^{++}$GaInAsP/n$^{++}$GaInAsP, or p$^{++}$GaAsSb/n$^{++}$GaAsSb. Note that the p$^{++}$ layer or the n$^{++}$ layer in a combination may be exchanged with one in another combination.

Semiconductor Layers Constituting Driving Thyristor S and Permission Circuit 27

The n-cathode layer 85 is, for example, n-type $Al_{0.9}GaAs$ having an impurity concentration of $1\times10^{18}$/cm$^3$. The Al composition may be changed within a range of 0 to 1.

The p-gate layer 86 is, for example, p-type $Al_{0.9}GaAs$ having an impurity concentration of $1\times10^{17}$/cm$^3$. The Al composition may be changed within a range of 0 to 1.

The n-gate layer 87 is, for example, n-type $Al_{0.9}GaAs$ having an impurity concentration of $1\times10^{17}$/cm$^3$. The Al composition may be changed within a range of 0 to 1.

The p-anode layer 88 is, for example, p-type $Al_{0.9}GaAs$ having an impurity concentration of $1\times10^{18}$/cm$^3$. The Al composition may be changed within a range of 0 to 1.

Method for Producing Light-Emitting Device 4

The light-emitting device 4 is produced as follows.

The n-cathode layer 81, the light emission layer 82, the p-anode layer 83, the tunnel junction layer 84, the n-cathode layer 85, the p-gate layer 86, the n-gate layer 87, and the p-anode layer 88 are stacked in order on the substrate 80. Next, the p-anode layer 88, the n-gate layer 87, the p-gate layer 86, the n-cathode layer 85, the tunnel junction layer 84, the p-anode layer 83, the light emission layer 82, and the n-cathode layer 81 are etched to form portions separating the light-emitting units 22 and the light emission permission unit 26 and the holes 342.

Then, the current constriction layer in the p-anode layer 83 is oxidized from the side surface of the hole 342 in oxidizing atmosphere to form the current blocking portion β.

Furthermore, a part of the p-anode layer 88 is etched to expose a surface of the n-gate layer 87. Then, the p-ohmic electrodes 321 and 322 are formed on the p-anode layer 88, and the n-gate electrodes 331, 332, 333, 334, 335, 336, and 337 that make ohmic contact with the n-gate layer 87 are formed on the n-gate layer 87. Note that the p-ohmic electrodes 321 and 322 are, for example, made of a material such as Zn-containing Au (AuZn) that makes ohmic contact with p-type AlGaAs. The n-gate electrodes 331, 332, 333, 334, 335, 336, and 337 are, for example, made of a material such as Ge-containing Au (AuGe) that makes ohmic contact with n-type AlGaAs.

The insulating layer 89, the p-anode layer 88, the n-gate layer 87, the p-gate layer 86, the n-cathode layer 85, and the tunnel junction layer 84 are etched to form the light emission opening 341 and the islands 303 and 304. Next, the insulating layer 89 is formed on a front face. The insulating layer 89 is, for example, $SiO_2$ or SiN.

Then, a through-hole is formed in a portion of the insulating layer 89 where the p-ohmic electrode 321 is provided, and the electrode for light emission 72, the reference voltage line 73, the power supply voltage line 74, the connection line 75, and the signal terminals 24 are formed.

As described above, in a case where the light-emitting diode LED and the driving thyristor S are stacked, light emission of the light-emitting diode LED is controlled by shifting the driving thyristor S from an off state to an on state. That is, light emission of the light-emitting diode LED can be controlled more easily than a case where the light-emitting diode LED and the driving thyristor S are not stacked.

In the present exemplary embodiment, the light-emitting diode LED and the driving thyristor S that are connected in series are provided in this order on the substrate 80 as an example of a light-emitting element. The driving thyristor S and the light-emitting diode LED may be stacked in this order on the substrate 80.

Although the n-type substrate 80 is used in the present exemplary embodiment, the light-emitting device 4 having an opposite polarity may be provided by using a p-type substrate. In this case, the light-emitting diode LED and the driving thyristor S that are connected in series may be provided in this order on the substrate 80 or the driving thyristor S and the light-emitting diode LED may be stacked in this order.

Furthermore, although the light-emitting diode LED and the driving thyristor S that are connected in series are an example of a light-emitting element, a driving thyristor having a light emission function may be used without using the light-emitting diode LED.

In the present exemplary embodiment, the light-emitting units 22 are configured so that light-emitting elements (the light-emitting diodes LED in the present exemplary embodiment) of the same light-emitting unit 22 are adjacent to each other. This makes the configuration of the light-emitting units 22 easy. However, the light-emitting elements need not be gathered, and light-emitting elements connected to the same signal terminal 24 of the terminal unit 23 may be regarded as a single light-emitting unit 22.

Although an example in which the light-emitting device 4 is used together with the 3D sensor 5 in the present exemplary embodiment, this is not restrictive. The present exemplary embodiment may be applied to a light-emitting device used for optical transmission. In this case, the light-emitting device 4 may be combined with an optical transmission path and light emission permitted by the permission signal φf may be introduced into the same optical transmission path or may be introduced into different transmission paths.

The foregoing description of the exemplary embodiments of the present disclosure has been provided for the purposes of illustration and description. It is not intended to be exhaustive or to limit the disclosure to the precise forms disclosed. Obviously, many modifications and variations will be apparent to practitioners skilled in the art. The embodiments were chosen and described in order to best explain the principles of the disclosure and its practical applications, thereby enabling others skilled in the art to understand the disclosure for various embodiments and with the various modifications as are suited to the particular use contemplated. It is intended that the scope of the disclosure be defined by the following claims and their equivalents.

What is claimed is:

1. A light-emitting device comprising:
    a substrate;
    one or more light-emitting units each comprising a light-emitting element and a first thyristor;
    a first electrode to which a first voltage is applied for light emission of the light-emitting units; and
    one or more second thyristors that permit the light-emitting element to emit light by a second voltage that is lower than the first voltage and set irrespective of the first voltage, wherein:
    the light-emitting units each include one or more light-emitting elements;
    the second thyristors correspond to respective ones of the light-emitting units;
    both of the light-emitting units and the second thyristors are on the substrate;
    the second thyristors are between a member that supplies the second voltage from outside the substrate and the light-emitting units on the substrate; and
    further comprising a terminal that supplies the second voltage for each of the second thyristors corresponding to the light-emitting units, wherein:
    the substrate has a first side surface and a second side surface that face each other and a third side surface and a fourth side surface that connect the first side surface and the second side surface and face each other;
    the member that supplies the second voltage is on the substrate adjacent the first side; and
    the terminal is on the substrate adjacent one or both of the first side surface and the second thyristors, which are adjacent the third side surface and the fourth side surface .

2. The light-emitting device according to claim 1, further comprising another terminal that supplies a reference voltage,
    wherein the other terminal is on the substrate.

3. A light-emitting device comprising:
    one or more light-emitting units each comprising a light-emitting element and a first thyristor;
    a first electrode to which a first voltage is applied for light emission of the light-emitting units; and
    one or more second thyristors that permit the light-emitting element to emit light by a second voltage that is lower than the first voltage and set irrespective of the first voltage, wherein
    the light-emitting element includes a planar light-emitting diode and the first thyristor is stacked on the planar light-emitting diode and causes the planar light-emitting diode to emit light when the first thyristor is in an on state.

4. The light-emitting device according to claim 3, further comprising a bipolar transistor connected to the second thyristor,
    wherein the bipolar transistor is connected to the first thyristor, and when the second thyristor shifts to an on state, the bipolar transistor shifts to an on state so that the first thyristor becomes capable of shifting to an on state.

5. The light-emitting device according to claim 3, wherein:
    the planar light-emitting diode is a vertical cavity surface emitting laser.

6. The light-emitting device according to claim 4, wherein:
    the planar light-emitting diode is a vertical cavity surface emitting laser.

* * * * *